(12) United States Patent
Yang

(10) Patent No.: US 11,431,335 B2
(45) Date of Patent: Aug. 30, 2022

(54) POWER-ON RESET CIRCUIT

(71) Applicant: SHENZHEN GOODIX TECHNOLOGY CO., LTD., Shenzhen (CN)

(72) Inventor: Jiang Yang, Shenzhen (CN)

(73) Assignee: SHENZHEN GOODIX TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 17/473,512

(22) Filed: Sep. 13, 2021

(65) Prior Publication Data

US 2022/0103168 A1  Mar. 31, 2022

Related U.S. Application Data

(63) Continuation of application No. PCT/CN2020/119598, filed on Sep. 30, 2020.

(51) Int. Cl.
*H03K 17/22* (2006.01)
*G05F 3/26* (2006.01)

(52) U.S. Cl.
CPC ........... *H03K 17/223* (2013.01); *G05F 3/262* (2013.01)

(58) Field of Classification Search
None
See application file for complete search history.

(56) References Cited

U.S. PATENT DOCUMENTS

| 6,847,240 B1 | 1/2005 | Zhou | |
|---|---|---|---|
| 9,270,265 B2 * | 2/2016 | Nakamoto | ........... H03K 17/223 |
| 9,760,108 B2 * | 9/2017 | Liu | ........................ G05F 3/267 |
| 2004/0113661 A1 | 6/2004 | Kinoshita et al. | |
| 2005/0134334 A1 | 6/2005 | Mikyska | |
| 2014/0111259 A1 | 4/2014 | Lin | |

FOREIGN PATENT DOCUMENTS

| CN | 103091548 | 5/2013 |
|---|---|---|
| CN | 103095265 | 5/2013 |
| CN | 104601152 | 5/2015 |
| CN | 105634453 | 6/2016 |
| CN | 105790742 | 7/2016 |
| CN | 205377819 | 7/2016 |
| CN | 106027006 | 10/2016 |
| CN | 107078735 | 8/2017 |
| JP | 2013219454 A | 10/2013 |

* cited by examiner

*Primary Examiner* — Jeffery S Zweizig
(74) *Attorney, Agent, or Firm* — Emerson, Thomson & Bennett, LLC; Roger D. Emerson; Warren A. Rosborough

(57) ABSTRACT

A power-on reset circuit, including: a band-gap reference circuit, a current comparator, and a voltage comparison circuit powered by a voltage source; a first output terminal of the band-gap reference circuit connects to a control terminal of the current comparator; a first current input terminal and a second current input terminal of the current comparator receives a first current signal and a second current signal respectively, and an output terminal of the current comparator connects to a control terminal of the voltage comparison circuit; and a first input terminal of the voltage comparison circuit connects to the first output terminal of the band-gap reference circuit, a second input terminal thereof receives a signal indicating a voltage value of the voltage source, an output terminal thereof outputs a reset signal, thereby avoiding occurrence of an error caused by output of the reset signal when the reference generating circuit is unstable.

20 Claims, 9 Drawing Sheets

POWER-ON RESET CIRCUIT

CROSS REFERENCE TO RELATED APPLICATIONS

The present disclosure is a continuation of international application No. PCT/CN2020/119598, filed on Sep. 30, 2020, which is hereby incorporated by reference in its entirety.

TECHNICAL FIELD

Embodiments of the present disclosure relate to the field of sensor technologies, and specifically to a power-on reset circuit.

BACKGROUND

A power-on reset circuit (POR) is used to output a reset signal to other functional circuit modules within a chip after the chip is powered on, so that the chip starts to work. In some application scenarios, a power supply voltage may be affected by temperature. In order to reduce the influence of temperature on voltage, and provide a stable voltage to the chip, a band-gap reference circuit connected to the power supply voltage is usually used to provide a stable voltage to the chip. In an example application scenario, during the power-on process, the power supply voltage starts to increase from zero potential, and the band-gap reference circuit, driven by the power supply voltage, also starts to work. When the power supply voltage increases to a preset value, the power-on reset circuit outputs a reset signal, but in an actual situation, the band-gap reference circuit may not be stable yet, and thus the voltage provided to the chip is not stable yet. In this case, if the chip starts to work after receiving the reset signal, it is likely to cause an error and cause the chip to fail to start normally.

SUMMARY OF THE INVENTION

In view of this, one of the technical problems to be solved by embodiments of the present disclosure is to provide a power-on reset circuit, to overcome the defect in the prior art that occurrence of an error is caused by output of a reset signal when the band-gap reference circuit is unstable.

An embodiment of the present disclosure provides a power-on reset circuit, including: a band-gap reference circuit, a current comparator, and a voltage comparison circuit, the band-gap reference circuit, the current comparator, and the voltage comparison circuit being powered by a voltage source;

where a first output terminal of the band-gap reference circuit is connected to a control terminal of the current comparator, for inputting a first signal to the control terminal of the current comparator to control operation of the current comparator;

a first current input terminal of the current comparator receives a first current signal, a second current input terminal of the current comparator receives a second current signal, and an output terminal of the current comparator is connected to a control terminal of the voltage comparison circuit for inputting a second signal to the control terminal of the voltage comparison circuit to control operation of the voltage comparison circuit; and a first input terminal of the voltage comparison circuit is connected to the first output terminal of the band-gap reference circuit, a second input terminal of the voltage comparison circuit receives a signal indicating a voltage value of the voltage source, and an output terminal of the voltage comparison circuit is used to output a reset signal.

Alternatively, in an embodiment of the present disclosure, the current comparator includes a first switch and a current mirror;

a first input terminal of the current mirror receives the first current signal; and a first terminal of the first switch is the second current input terminal and the output terminal of the current comparator, a second terminal of the first switch is connected to a second input terminal of the current mirror, and a control terminal of the first switch is the control terminal of the current comparator.

Alternatively, in an embodiment of the present disclosure, the first switch includes a first field effect transistor;

a drain electrode of the first field effect transistor is the first terminal of the first switch, a source electrode of the first field effect transistor is the second terminal of the first switch, and a grid electrode of the first field effect transistor is the control terminal of the first switch; and the drain electrode of the first field effect transistor receives the second current signal, the source electrode of the first field effect transistor is connected to the second input terminal of the current mirror, and the grid electrode of the first field effect transistor is connected to the first output terminal of the band-gap reference circuit.

Alternatively, in an embodiment of the present disclosure, the current comparator further includes a voltage limiting element;

a first terminal of the voltage limiting element is the first current input terminal of the current comparator, a second terminal of the voltage limiting element is connected to the first input terminal of the current mirror, and the first input terminal of the current mirror receives the first current signal through the voltage limiting element.

Alternatively, in an embodiment of the present disclosure, the voltage limiting element includes a second field effect transistor;

a source electrode of the second field effect transistor is the first terminal of the voltage limiting element, and a drain electrode of the second field effect transistor is the second terminal of the voltage limiting element; and the source electrode of the second field effect transistor receives the first current signal, the drain electrode of the second field effect transistor is connected to the first input terminal of the current mirror, and a grid electrode of the second field effect transistor is connected to the drain electrode of the second field effect transistor.

Alternatively, in an embodiment of the present disclosure, the current mirror includes a third field effect transistor and a fourth field effect transistor;

a drain electrode of the third field effect transistor is the first input terminal of the current mirror, and a drain electrode of the fourth field effect transistor is the second input terminal of the current mirror; and the drain electrode of the third field effect transistor is connected to a grid electrode of the third field effect transistor, and the grid electrode of the third field effect transistor is connected to a grid electrode of the fourth field effect transistor.

Alternatively, in an embodiment of the present disclosure, a current of the first current signal is greater than a current of the second current signal, and the second signal is a high-level signal.

Alternatively, in an embodiment of the present disclosure, the voltage comparison circuit includes a voltage division control branch and a voltage comparator;

an input terminal of the voltage division control branch is the second input terminal of the voltage comparison circuit, a control terminal of the voltage division control branch is the control terminal of the voltage comparison circuit, the control terminal of the voltage division control branch is connected to the output terminal of the current comparator, a first output terminal of the voltage division control branch is connected to a non-inverting input terminal of the voltage comparator, and a second output terminal of the voltage division control branch is grounded; and an inverting input terminal of the voltage comparator is the first input terminal of the voltage comparison circuit, an output terminal of the voltage comparator is the output terminal of the voltage comparison circuit, and the inverting input terminal of the voltage comparator is connected to the first output terminal of the band-gap reference circuit.

Alternatively, in an embodiment of the present disclosure, the voltage division control branch includes a voltage comparator, a second switch, a first resistor, and a second resistor;

where a first terminal of the second switch is the input terminal of the voltage division control branch, a control terminal of the second switch is the control terminal of the voltage division control branch, and the output terminal of the voltage comparator is the output terminal of the voltage comparison circuit;

the first terminal of the second switch is connected to the voltage source, and a second terminal of the second switch is connected to a first terminal of the first resistor;

a second terminal of the first resistor is the first output terminal of the voltage division control branch, the second terminal of the first resistor is connected to a first terminal of the second resistor, and the second terminal of the first resistor is connected to the non-inverting input terminal of the voltage comparator; and a second terminal of the second resistor is the second output terminal of the voltage division control branch, and the second terminal of the second resistor is grounded.

Alternatively, in an embodiment of the present disclosure, the second switch includes a fifth field effect transistor;

a grid electrode of the fifth field effect transistor is the control terminal of the second switch, a source electrode of the fifth field effect transistor is the first terminal of the second switch, and a drain electrode of the fifth field effect transistor is the second terminal of the second switch; and the grid electrode of the fifth field effect transistor is connected to the output terminal of the current comparator, the source electrode of the fifth field effect transistor is connected to the voltage source, and the drain electrode of the fifth field effect transistor is connected to the first terminal of the first resistor.

Alternatively, in an embodiment of the present disclosure, the voltage comparison circuit further includes an inverter;

an input terminal of the inverter is connected to the output terminal of the current comparator, and an output terminal of the inverter is connected to an enable terminal of the voltage comparator for inputting an enable signal to the enable terminal of the voltage comparator.

Alternatively, in an embodiment of the present disclosure, the first current signal and the second current signal are from the band-gap reference circuit, a second output terminal of the band-gap reference circuit is connected to the first current input terminal of the current comparator for inputting the first current signal to the current comparator; and a third output terminal of the band-gap reference circuit is connected to the second current input terminal of the current comparator for inputting the second current signal to the current comparator.

Alternatively, in an embodiment of the present disclosure, the band-gap reference circuit includes a start-up circuit and a reference generating circuit;

a first output terminal of the reference generating circuit is the first output terminal of the band-gap reference circuit, a second output terminal of the reference generating circuit is the second output terminal of the band-gap reference circuit, and a third output terminal of the reference generating circuit is the third output terminal of the band-gap reference circuit; and an input terminal of the start-up circuit is connected to the first output terminal of the reference generating circuit, and a first trigger node of the start-up circuit is connected to a second trigger node of the reference generating circuit for inputting a trigger signal to the second trigger node of the reference generating circuit to trigger operation of the reference generating circuit.

Alternatively, in an embodiment of the present disclosure, the reference generating circuit includes a first branch, a second branch, and a third branch that are connected in parallel to each other, and an operation amplifier;

the first branch, the second branch, and the third branch are connected to the voltage source;

an output terminal of the first branch is connected to an inverting input terminal of the operation amplifier, an output terminal of the second branch is connected to a non-inverting input terminal of the operation amplifier, and a correlation between a voltage and a temperature at the output terminal of the first branch is different from a correlation between a voltage and a temperature at the output terminal of the second branch;

an output terminal of the operation amplifier is connected to a control terminal of the first branch, a control terminal of the second branch, and a control terminal of the third branch respectively, and the control terminal of the first branch and the control terminal of the second branch are trigger nodes of the reference generating circuit; and an output terminal of the third branch is the first output terminal of the reference generating circuit.

Alternatively, in an embodiment of the present disclosure, the reference generating circuit further includes a fourth branch and a fifth branch that are connected in parallel to each other;

an output terminal of the fourth branch is the second output terminal of the reference generating circuit, an input terminal of the fourth branch is connected to the voltage source, a control terminal of the fourth branch is connected to the output terminal of the operation amplifier, and the output terminal of the fourth branch is connected to the first current input terminal of the current comparator for inputting the first current signal to the current comparator; and an output terminal of the fifth branch is the third output terminal of the reference generating circuit, an input terminal of the fifth branch is connected to the voltage source, a control terminal of the fifth branch is connected to the output terminal of the operation amplifier, and the output terminal of the fifth branch is connected to the second current input terminal of the current comparator for inputting the second current signal to the current comparator.

Alternatively, in an embodiment of the present disclosure, the fourth branch includes a sixth field effect transistor;

a grid electrode of the sixth field effect transistor is the control terminal of the fourth branch, a source electrode of the sixth field effect transistor is the input terminal of the fourth branch, and a drain electrode of the sixth field effect transistor is the output terminal of the fourth branch; and the source electrode of the sixth field effect transistor is connected to the voltage source, the grid electrode of the sixth field effect transistor is connected to the output terminal of the operation amplifier, and the drain electrode of the sixth field effect transistor is connected to the first current input terminal of the current comparator.

Alternatively, in an embodiment of the present disclosure, the fifth branch includes a seventh field effect transistor;

a grid electrode of the seventh field effect transistor is the control terminal of the fifth branch, a source electrode of the seventh field effect transistor is the input terminal of the fifth branch, and a drain electrode of the seventh field effect transistor is the output terminal of the fifth branch; and the source electrode of the seventh field effect transistor is connected to the voltage source, the grid electrode of the seventh field effect transistor is connected to the output terminal of the operation amplifier, and the drain electrode of the seventh field effect transistor is connected to the second current input terminal of the current comparator.

Alternatively, in an embodiment of the present disclosure, the third branch includes an eighth field effect transistor and a third resistor;

a drain electrode of the eighth field effect transistor is the output terminal of the third branch; a source electrode of the eighth field effect transistor is connected to the voltage source, a grid electrode of the eighth field effect transistor is connected to the output terminal of the operation amplifier, the drain electrode of the eighth field effect transistor is connected to a first terminal of the third resistor; and a second terminal of the third resistor is grounded.

Alternatively, in an embodiment of the present disclosure, the first branch includes a first bipolar junction transistor, a ninth field effect transistor, and a fourth resistor;

a grid electrode of the ninth field effect transistor is the control terminal of the first branch, and a drain electrode of the ninth field effect transistor is the output terminal of the first branch;

a source electrode of the ninth field effect transistor is connected to the voltage source, the grid electrode of the ninth field effect transistor is connected to the output terminal of the operation amplifier, and the drain electrode of the ninth field effect transistor is connected to the non-inverting input terminal of the operation amplifier;

one terminal of the fourth resistor is connected to the drain electrode of the ninth field effect transistor, and the other terminal of the fourth resistor is grounded; and an emitter electrode of the first bipolar junction transistor is connected to the drain electrode of the ninth field effect transistor, and a base electrode and a collector electrode of the first bipolar junction transistor are both grounded.

Alternatively, in an embodiment of the present disclosure, the second branch includes a second bipolar junction transistor, a tenth field effect transistor, a fifth resistor, and a sixth resistor;

a grid electrode of the tenth field effect transistor is the control terminal of the second branch, and a drain electrode of the tenth field effect transistor is the output terminal of the second branch;

a source electrode of the tenth field effect transistor is connected to the voltage source, the grid electrode of the tenth field effect transistor is connected to the output terminal of the operation amplifier, and the drain electrode of the tenth field effect transistor is connected to the non-inverting input terminal of the operation amplifier;

one terminal of the fifth resistor is connected to the drain electrode of the tenth field effect transistor, and the other terminal of the fifth resistor is connected to the emitter electrode of the second bipolar junction resistor;

one terminal of the sixth resistor is connected to the drain electrode of the tenth field effect transistor, and the other terminal of the sixth resistor is grounded; and a collector electrode and a base electrode of the second bipolar junction transistor are both grounded.

Alternatively, in an embodiment of the present disclosure, the power-on reset circuit further includes a start-up circuit;

an input terminal of the start-up circuit is connected to the first output terminal of the reference generating circuit, and a first trigger node of the start-up circuit is connected to a second trigger node of the reference generating circuit for inputting a trigger signal to the second trigger node of the reference generating circuit to trigger operation of the reference generating circuit.

Alternatively, in an embodiment of the present disclosure, the start-up circuit includes an eleventh field effect transistor, a twelfth field effect transistor, and a thirteenth field effect transistor;

where a grid electrode of the eleventh field effect transistor and a grid electrode of the twelfth field effect transistor are the input terminal of the start-up circuit, and a drain electrode of the thirteenth field effect transistor is the first trigger node;

a source electrode of the eleventh field effect transistor is connected to the voltage source, the grid electrode of the eleventh field effect transistor is connected to the first output terminal of the reference generating circuit, and the drain electrode of the eleventh field effect transistor is connected to a drain electrode of the twelfth field effect transistor and a grid electrode of the thirteenth field effect transistor respectively;

the grid electrode of the twelfth field effect transistor is connected to the first output terminal of the reference generating circuit, and a source electrode of the twelfth field effect transistor is grounded; and the drain electrode of the thirteenth field effect transistor is connected to the second trigger node, and a source electrode of the thirteenth field effect transistor is grounded.

A power-on reset circuit provided in embodiments of the present disclosure includes a band-gap reference circuit, a current comparator, and a voltage comparison circuit. The band-gap reference circuit, the current comparator, the voltage comparison circuit are powered by a voltage source. A first signal outputted from the band-gap reference circuit can control the current comparator to work, and the current comparator is powered by the voltage source. Therefore, only after both the power supply voltage and the band-gap reference circuit meet the requirements, will the current comparator work and output a second signal. The outputted second signal is used to control the voltage comparator to work and output a reset signal, thereby avoiding occurrence of an error caused by output of the reset signal when the band-gap reference circuit is unstable, reducing false trigger during the power-on process, and increasing the power-on reliability.

BRIEF DESCRIPTION OF THE DRAWINGS

Some specific embodiments of embodiments of the present disclosure will be described in detail below with reference to the accompanying drawings in an exemplary manner, instead of in a limiting manner. Identical reference numerals in the accompanying drawings represent identical or similar components or parts. Those skilled in the art should understand that these figures may not be drawn to scale. In the figures.

DETAILED DESCRIPTION

Specific implementations of embodiments of the present disclosure will be further described below with reference to the accompanying drawings of the embodiments of the present disclosure.

Embodiment I

Figure 1:
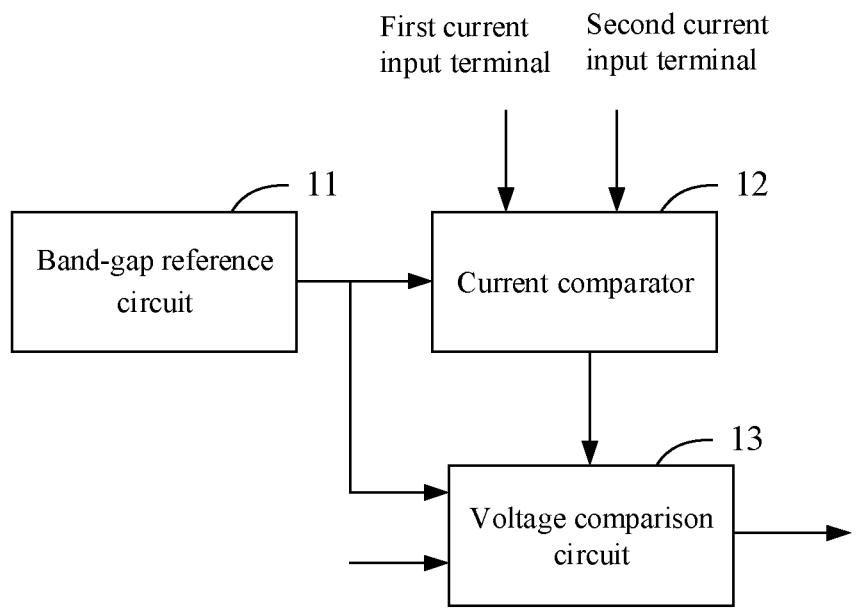
FIG. 1 is a structural diagram of a power-on reset circuit provided in Embodiment I of the present disclosure.

Embodiment I of the present disclosure provides a power-on reset circuit. As shown in FIG. 1, FIG. 1 is a structural diagram of a power-on reset circuit provided in this embodiment of the present disclosure. The power-on reset circuit 10 provided in this embodiment of the present disclosure includes: a band-gap reference circuit 11, a current comparator 12, and a voltage comparison circuit 13, the band-gap reference circuit 11, the current comparator 12, and the voltage comparison circuit 13 being powered by a voltage source;

where a first output terminal of the band-gap reference circuit 11 is connected to a control terminal of the current comparator 12, for inputting a first signal to the control terminal of the current comparator 12 to control operation of the current comparator 12;

a first current input terminal of the current comparator 12 receives a first current signal, a second current input terminal of the current comparator 12 receives a second current signal, and an output terminal of the current comparator 12 is connected to a control terminal of the voltage comparison circuit 13 for inputting a second signal to the control terminal of the voltage comparison circuit 13 to control operation of the voltage comparison circuit 13; and a first input terminal of the voltage comparison circuit 13 is connected to the first output terminal of the band-gap reference circuit 11, a second input terminal of the voltage comparison circuit 13 is used to indicate a signal of a voltage value of the voltage source, and an output terminal of the voltage comparison circuit 13 is used to output a power-on reset signal (abbreviated as: reset signal).

It should be noted that, alternatively, the voltage source may include a voltage conversion module in a chip, and a signal outputted from the voltage source may be a signal outputted from the voltage conversion module. Of course, only example description is provided here. Because it takes certain time for an electrical signal to flow through an element in the chip in a process of powering on the chip, the voltage of the voltage source has a rising process, and only when the voltage of the voltage source rises to a stable state, can the chip start to work.

Alternatively, the band-gap reference circuit 11 is used to output a stable voltage. Generally, the band-gap reference circuit 11 includes two channels of signals. There is a positive correlation between a voltage and a temperature of the first channel of signal, and a negative correlation between a voltage and a temperature of the second channel of signal. By fusing the two channels of signals, an output signal that is less affected by temperature or not affected by temperature may be obtained, i.e., a first signal outputted from the first output terminal of the band-gap reference circuit 11.

The band-gap reference circuit 11 outputs the first signal to the current comparator 12, and the current comparator 12 starts to work after a voltage of the first signal is greater than or equal to a first preset value and the power supply voltage is greater than or equal to a second preset value. The output terminal of the current comparator 12 outputs a second signal to the control terminal of the voltage comparison circuit 13. It should be noted that the second preset value is greater than or equal to an operating voltage of the current comparator 12. It should be noted that the voltage source may be directly connected to the current comparator 12 to power the current comparator 12, or the voltage source may power the current comparator 12 through the band-gap reference circuit 11. A comparison result of the current comparator 12 may be fixed. For example, if the control terminal of the voltage comparison circuit 13 starts to work after receiving a low-level signal, the current comparator 12 may fixedly output a low-level signal, i.e., the second signal is a low-level signal. For another example, if the control terminal of the voltage comparison circuit 13 starts to work after receiving a high-level signal, the current comparator 12 may fixedly output a high-level signal, i.e., the second signal is a high-level signal. Alternatively, in an embodiment of the present disclosure, a current of the first current signal is greater than a current of the second current signal, and the second signal is a high-level signal.

After receiving the second signal, the control terminal of the voltage comparison circuit 13 starts to work, and compares the first signal outputted from the band-gap reference circuit 11 with a signal for indicating a voltage value of the voltage source. When the signal for indicating the voltage value of the voltage source is greater than the first signal outputted from the band-gap reference circuit 11, it means that the power supply voltage meets the requirements, and the voltage comparison circuit 13 outputs a reset signal. It should be noted that when the signal for indicating the voltage value of the voltage source is greater than the first signal outputted from the band-gap reference circuit 11, the power supply voltage in this case may be greater than or equal to the second preset value.

The current comparator 12 needs to output the second signal provided that both of the following conditions are satisfied: 1) The power supply voltage is greater than or equal to the second preset value, i.e., the power supply voltage reaches a stable operating voltage that can make the current comparator work, and 2) the first signal outputted from the band-gap reference circuit 11 to the current comparator 12 is greater than or equal to the first preset value, i.e., the first signal outputted from the band-gap reference circuit 11 reaches a stable voltage controlling an output from the current comparator, and the second signal controls the operation of the voltage comparison circuit. Therefore, the voltage comparison circuit 13 can start to work, only when the power supply voltage is greater than or equal to the second preset value, and the first signal outputted from the band-gap reference circuit 11 is greater than or equal to the first preset value. Only after satisfying the above two conditions and starting to work, will the voltage comparison circuit compare the signal for indicating the voltage value of the voltage source and a value of the first signal outputted from the band-gap reference circuit 11, and output a reset signal. Thus, the preconditions for outputting a reset signal not only include the signal for indicating the voltage of the voltage source being high enough, but also include the power supply voltage and the band-gap reference circuit satisfying the above two conditions, thereby avoiding occurrence of an error caused by output of the reset signal when the band-gap reference circuit 13 is unstable, reducing false trigger during the power-on process, and increasing the power-on reliability.

Further, the voltage comparison circuit may output a reset signal when the signal for indicating the voltage value of the voltage source is greater than the voltage of the first signal. The voltage comparison circuit 13 will start to work under the control of the current comparator 12 only when the power supply voltage is greater than or equal to the second threshold and the first signal outputted from the band-gap reference circuit is greater than or equal to the first threshold, and will output a reset signal only when the voltage of the signal for indicating the voltage value of the voltage source is greater than the voltage of the first signal outputted from the band-gap reference circuit 11, thereby avoiding occurrence of an error caused by output of the reset signal when the band-gap reference circuit 11 is unstable, reducing false trigger during the power-on process, and increasing the power-on reliability.

Embodiment II

Figure 2:
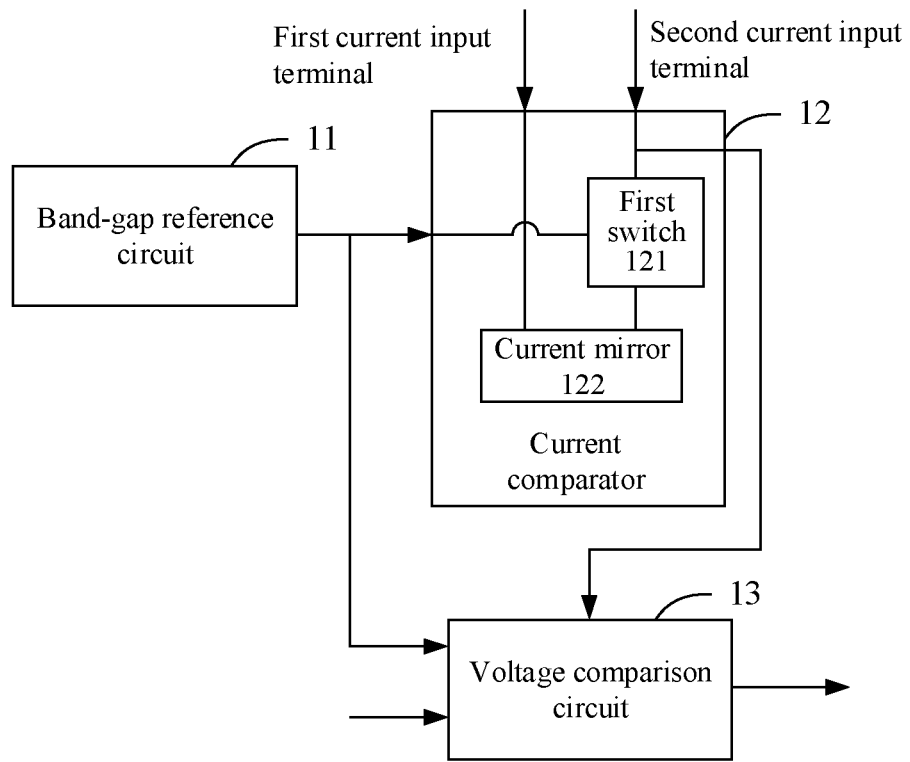
FIG. 2 is a structural diagram of a power-on reset circuit provided in Embodiment II of the present disclosure.

Embodiment II of the present disclosure further shows, based on the structure of the power-on reset circuit in Embodiment I, a structure of the current comparator 12 of the power-on reset circuit as an example. Of course, only example description is provided here, and does not mean that the present disclosure is limited to this. As shown in FIG. 2, FIG. 2 is a structural diagram of a power-on reset circuit provided in Embodiment II of the present disclosure. Alternatively, in this embodiment, the current comparator 12 includes a first switch 121 and a current mirror 122;

a first input terminal of the current mirror 122 receives a first current signal; a first terminal of the first switch 121 is the second current input terminal and the output terminal of the current comparator 12, a second terminal of the first switch 121 is connected to a second input terminal of the current mirror 122, and a control terminal of the first switch 121 is the control terminal of the current comparator 12 connected to the band-gap reference circuit.

The first input terminal of the current mirror 122 inputs the first current signal, the current mirror 122 can copy a current, such that the second input terminal of the current mirror 122 also inputs the first current signal, and the first terminal of the first switch 121 inputs a second current signal. When a current of the first current signal is greater than a current of the second current signal, the first terminal of the first switch 121 is at a low level, and when a current of the first current signal is less than a current of the second current signal, the first terminal of the first switch 121 is at a high level. It should be noted that in one implementation, the first input terminal of the current mirror 122 may be the first current input terminal of the current comparator 12; and in another implementation, the first input terminal of the current mirror 122 is not the first current input terminal of the current comparator 12, and the first input terminal of the current mirror 122 may receive the first current signal through the first current input terminal of the current comparator 12.

It should be noted that there may be a plurality of forms of the first switch 121 and the current mirror 122. Here, two examples are provided to describe the first switch 121 and the current mirror 122 in detail.

Figure 3:
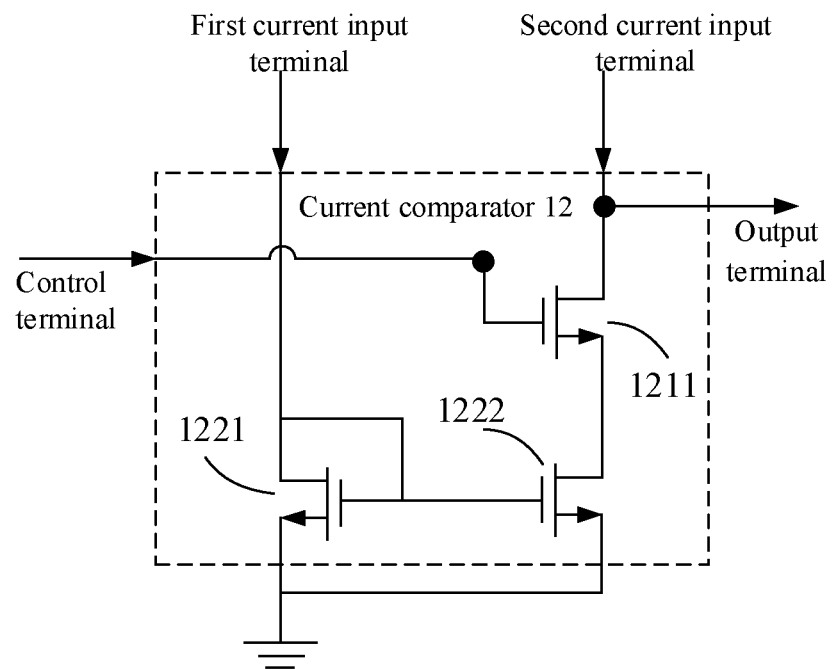
FIG. 3 is a structural diagram of a current comparator provided in Embodiment II of the present disclosure.

Alternatively, based on the above power-on reset circuit shown in FIG. 2, in the first example, the first switch 121 is further described. As shown in FIG. 3, FIG. 3 is a structural diagram of the current comparator 12 provided in Embodiment II. The first switch 121 includes a first field effect transistor 1211;

a drain electrode of the first field effect transistor 1211 is the first terminal of the first switch 121, a source electrode of the first field effect transistor 1211 is the second terminal of the first switch 121, and a grid electrode of the first field effect transistor 1211 is the control terminal of the first switch 121; and the drain electrode of the first field effect transistor 1211 receives the second current signal, the source electrode of the first field effect transistor 1211 is connected to the second input terminal of the current mirror 122, and the grid electrode of the first field effect transistor 1211 is connected to the first output terminal of the band-gap reference circuit 11.

It should be noted that the first field effect transistor 1211 may be an N-type field effect transistor. When the grid electrode of the first field effect transistor 1211 is at a high level, the first field effect transistor 1211 is switched on, and the current comparator 12 may output a signal. When the grid electrode of the first field effect transistor 1211 is at a low level, the first field effect transistor 1211 is switched off, and the current comparator 12 does not output a signal. The grid electrode of the first field effect transistor 1211 is connected to the first output terminal of the band-gap reference circuit 11. Therefore, only when the voltage of the first signal outputted from the first output terminal of the band-gap reference circuit 11 is at a high level (i.e., the voltage of the first signal is greater than the first preset value), will the current comparator 12 work, thereby more effectively controlling operation of the current comparator 12.

Alternatively, based on the above power-on reset circuit shown in FIG. 2, the current mirror 122 is further described in the second example. As shown in FIG. 3, the current mirror 122 includes a third field effect transistor 1221 and a fourth field effect transistor 1222; a drain electrode of the third field effect transistor 1221 is the first input terminal of the current mirror 122, and a drain electrode of the fourth field effect transistor 1222 is the second input terminal of the current mirror 122; and the drain electrode of the third field effect transistor 1221 is connected to a grid electrode of the third field effect transistor, and the grid electrode of the third field effect transistor 1221 is connected to a grid electrode of the fourth field effect transistor 1222.

FIG. 3 shows not only the first field effect transistor 1211, but also the third field effect transistor 1221 and the fourth field effect transistor 1222. This does not mean that the first field effect transistor 1211, the third field effect transistor 1221, and the fourth field effect transistor 1222 must be provided, and the current mirror 122 may also use other designs. FIG. 3 only shows a structure of the current comparator 12 as an example, and does not mean that the present disclosure is limited to this.

Figure 4:
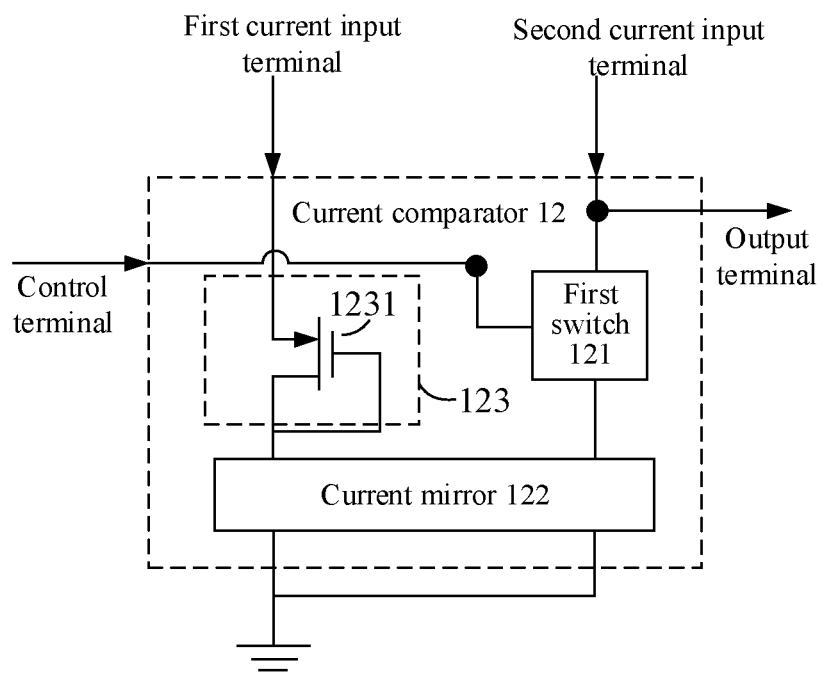
FIG. 4 is a structural diagram of another current comparator provided in Embodiment II of the present disclosure.

Based on the above current comparator 12 shown in FIG. 2, alternatively, in an embodiment of the present disclosure, as shown in FIG. 4, FIG. 4 is a structural diagram of another current comparator 12 provided in Embodiment II of the present disclosure. The current comparator 12 further includes a voltage limiting element 123.

A first terminal of the voltage limiting element 123 is the first current input terminal of the current comparator 12, a second terminal of the voltage limiting element 123 is connected to the first input terminal of the current mirror 122, and the first input terminal of the current mirror 122 receives the first current signal through the voltage limiting element 123.

Alternatively, in an embodiment of the present disclosure, as shown in FIG. 4, the voltage limiting element 123 includes a second field effect transistor 1231; a source electrode of the second field effect transistor 1231 is the first terminal of the voltage limiting element 123, and a drain electrode of the second field effect transistor 1231 is the second terminal of the voltage limiting element 123; and the source electrode of the second field effect transistor 1231 receives the first current signal, the drain electrode of the second field effect transistor 1231 is connected to the first input terminal of the current mirror 122, and a grid electrode of the second field effect transistor 1231 is connected to the drain electrode of the second field effect transistor 1231.

It should be noted that in one implementation, the first current signal and the second current signal may be from an independent current source, and in another implementation, the first current signal and the second current signal may be from the band-gap reference circuit 11. Of course, merely example description is provided here, and does not mean that the present disclosure is limited to this.

If the current comparator 12 works normally, voltages across all elements on each branch must be greater than or equal to a drive voltage. The voltage comparison circuit 12 is driven under the voltage provided by the voltage source. Therefore, the power supply voltage must be high enough to drive all elements on each branch (the branches are connected in parallel under the same voltage), and the voltage limiting element 123 is additionally provided in the current comparator 12 to make the power supply voltage be able to drive not only all elements on each branch in the original circuit, but also the voltage limiting element 123. Compared with the original circuit, the power supply voltage must be higher to enable the current comparator 12 to work, which is equivalent to increasing the second preset value to ensure that the current comparator 12 works when the power supply voltage is higher and more stable, thereby further improving the power-on reliability.

Embodiment III

Figure 5:
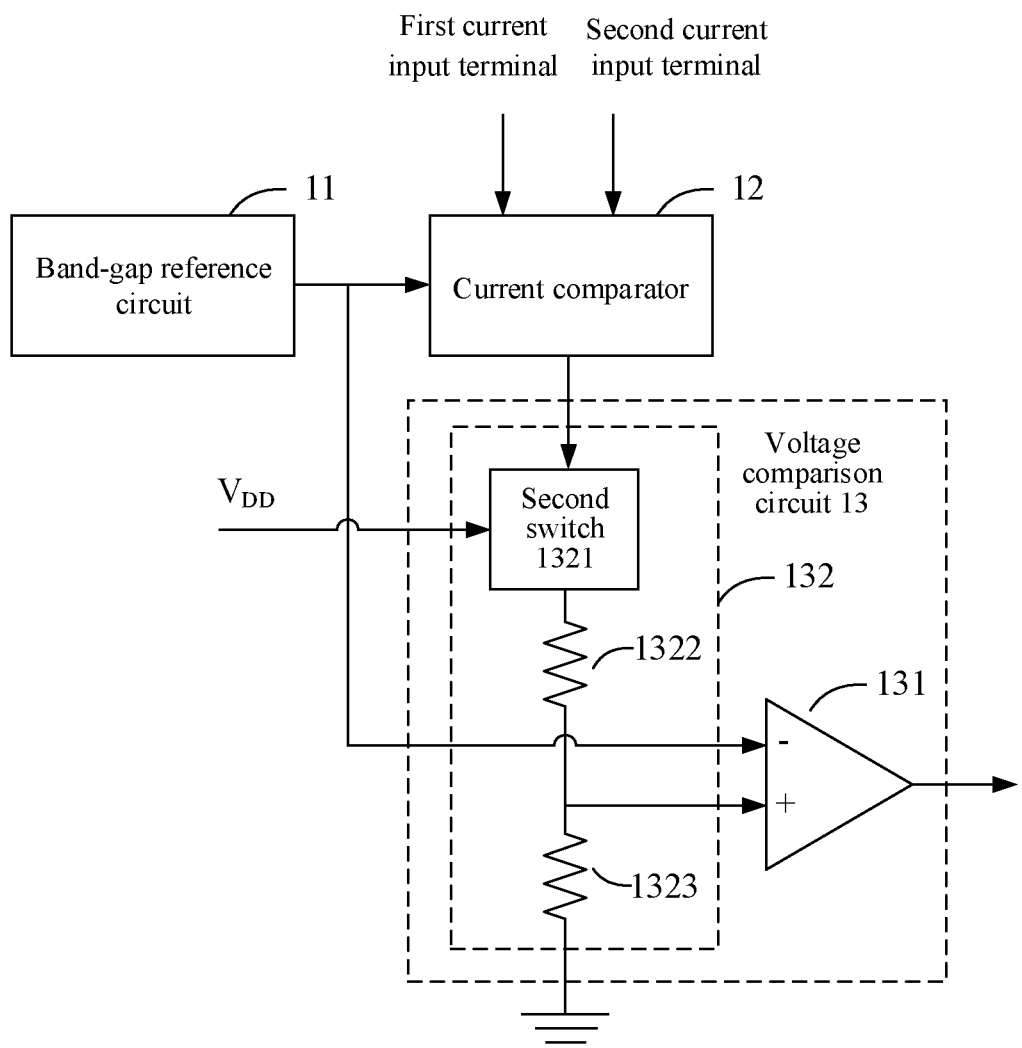
FIG. 5 is a structural diagram of a power-on reset circuit provided in Embodiment III of the present disclosure.

Embodiment III of the present disclosure further shows, based on the structure of the power-on reset circuit in Embodiment I, a structure of the voltage comparison circuit 13 of the power-on reset circuit as an example. Of course, only example description is provided here, and does not mean that the present disclosure is limited to this. As shown in FIG. 5, FIG. 5 is a structural diagram of a power-on reset circuit provided in Embodiment III of the present disclosure. Alternatively, the voltage comparison circuit 13 includes a voltage comparator 131 and a voltage division control branch 132; an input terminal of the voltage division control branch 132 is the second input terminal of the voltage comparison circuit 13, a control terminal of the voltage division control branch 132 is the control terminal of the voltage comparison circuit, the control terminal of the voltage division control branch 132 is connected to the output terminal of the current comparator, a first output terminal of the voltage division control branch 132 is connected to a non-inverting input terminal of the voltage comparator 131, and a second output terminal of the voltage division control branch 132 is grounded; and an inverting input terminal of the voltage comparator 131 is the first input terminal of the voltage comparison circuit, an output terminal of the voltage comparator 131 is the output terminal of the voltage comparison circuit, and the inverting input terminal of the voltage comparator 131 is connected to the first output terminal of the band-gap reference circuit.

Only after the voltage division control branch 132 receives the second signal outputted from the current comparator 12 through the control terminal, can the signal for indicating the voltage value of the voltage source be connected, and can the voltage comparison circuit 13 start to work. The signal for indicating the voltage value of the voltage source is finally inputted to the non-inverting input terminal of the voltage comparator 131, but because the voltage division control branch 132 has a voltage dividing function, a signal inputted to the non-inverting input terminal of the voltage comparator 131 may be, or may not be, equal to the voltage of the voltage source. A value of the signal inputted to the non-inverting input terminal of the voltage comparator 131 may be controlled by adjusting the voltage division element included in the voltage division control branch 132. Therefore, a voltage threshold of the voltage source that outputs a reset signal may be adjusted by adjusting the voltage division element. For example, because of the voltage dividing function of the voltage division control branch 132, a ratio of the voltage of the voltage source to the voltage of the signal inputted to the non-inverting input terminal of the voltage comparator 131 may be k, where k is an integer greater than or equal to 1, and the voltage of the signal at the non-inverting input terminal of the voltage comparator 131 is greater than the voltage of the first signal at the inverting input terminal. The voltage comparator 131 outputs a reset signal, i.e., the voltage of the voltage source shall be greater than k times the voltage of the first signal. If k becomes larger by adjusting the voltage division element, a reset signal can be outputted only when the voltage of the voltage source reaches a higher voltage value, and if k becomes smaller by adjusting the voltage division element, a reset signal can be outputted when the voltage of the voltage source reaches a smaller voltage value, thereby more flexibly adjusting the threshold of the voltage source.

Alternatively, in this embodiment, as shown in FIG. 5, the voltage division control branch 132 includes a second switch 1321, a first resistor 1322, and a second resistor 1323;

where a first terminal of the second switch 1321 is the input terminal of the voltage division control branch 132 (i.e., the second input terminal of the voltage comparison circuit 13), and a control terminal of the second switch 1321 is the control terminal of the voltage division control branch 132 (i.e., the control terminal of the voltage comparison circuit 13);

the first terminal of the second switch 1321 is connected to the voltage source, and a second terminal of the second switch 1321 is connected to a first terminal of the first resistor 1322;

a second terminal of the first resistor 1322 is the first output terminal of the voltage division control branch 132, the second terminal of the first resistor 1322 is connected to a first terminal of the second resistor 1323, and the second terminal of the first resistor 1322 is connected to the non-inverting input terminal of the voltage comparator 131; and a second terminal of the second resistor 1323 is the second output terminal of the voltage division control branch 132, and the second terminal of the second resistor 1323 is grounded.

It should be noted that, in FIG. 5, the voltage division element includes the first resistor 1322 and the second resistor 1323. This is only an example, and does not mean that the present disclosure is limited to this. Other elements for voltage division are also applicable. The inverting input terminal of the voltage comparator 131 is connected to the first output terminal of the band-gap reference circuit 11, i.e., the inverting input terminal of the voltage comparator 131 inputs a first signal $V_{BG}$ outputted from the band-gap reference circuit 11, and the non-inverting input terminal of the voltage comparator 131 is connected to a middle point between the first resistor 1322 and the second resistor 1323, i.e., the voltage of the signal inputted from the power supply voltage to the second terminal of the first resistor 1322, the first terminal of the second resistor 1323, and the non-inverting input terminal of the voltage comparator 131 is affected by resistance values of the first resistor 1322 and the second resistor 1323. For example, voltage value $V_{DETECT}$ of the signal inputted to the non-inverting input terminal of the voltage comparator 131 may be expressed by formula I as follows:

$$V_{DETECT}=V_{DD}\times R_2/(R_1+R_2);\qquad \text{formula I}$$

$V_{DD}$ denotes the power supply voltage, $R_1$ denotes the resistance value of the first resistor 1322, and $R_2$ denotes the resistance value of the second resistor 1323. If the voltage value of the signal inputted to the non-inverting input terminal of the voltage comparator 131 is higher than the voltage value of the first signal, the voltage comparator 131 outputs a reset signal.

According to formula I, threshold voltage $V_{TH}$ of the reset signal outputted from the voltage comparator 131 may be obtained, i.e., the voltage when the voltage of the signal inputted from the non-inverting input terminal is equal to the voltage of the first signal, which may be expressed by formula II as follows:

$$V_{TH}=V_{BG}\times(R_1+R_2)/R_2;\qquad \text{formula II}$$

$V_{BG}$ denotes the voltage of the first signal. Of course, only example description is provided here, which does not mean that the present disclosure is limited to this.

Figure 6:
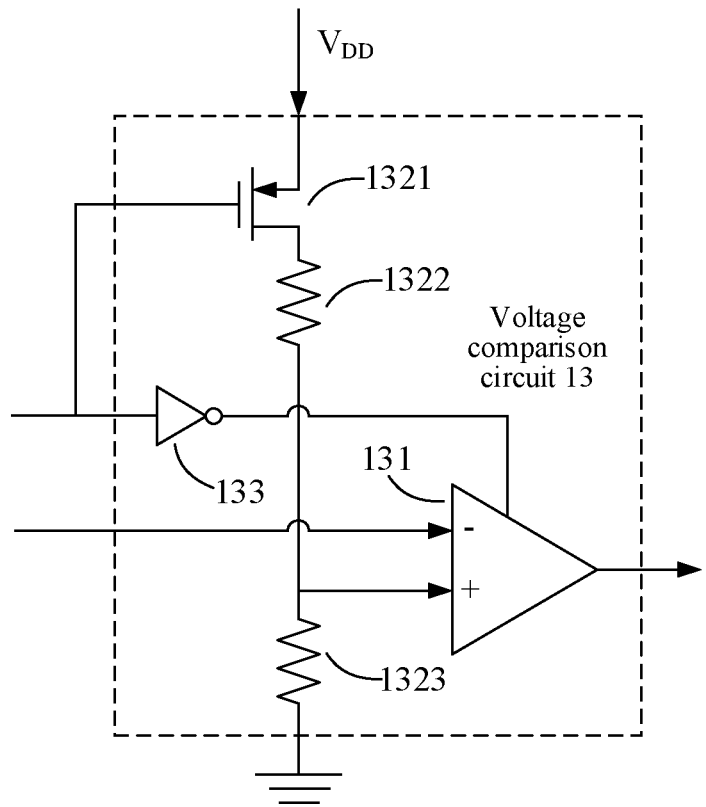
FIG. 6 is a structural diagram of a voltage comparison circuit provided in Embodiment III of the present disclosure.

Alternatively, based on the power-on reset circuit shown in FIG. 5, an enable signal of the voltage comparator 131 is described. As shown in FIG. 6, FIG. 6 is a structural diagram of the voltage comparison circuit 13 provided in Embodiment III of the present disclosure. In an embodiment of the present disclosure, the voltage comparison circuit 13 further includes an inverter 133;

an input terminal of the inverter is connected to the output terminal of the current comparator 12, and an output terminal of the inverter is connected to an enable terminal of the voltage comparator 131 for inputting an enable signal to the enable terminal of the voltage comparator 131.

If the second signal outputted from the current comparator 12 is at a low level, after the second signal passes through the inverter, the inverter outputs a high-level enable signal, such that the voltage comparator 131 works. Otherwise, if the signal outputted from the current comparator 12 is at a high level, after the signal passes through the inverter, the inverter outputs a low-level signal, and the voltage comparator 131 does not work.

Alternatively, in an embodiment of the present disclosure, as shown in FIG. 6, the second switch 1321 includes a fifth field effect transistor 13211;

a grid electrode of the fifth field effect transistor 13211 is the control terminal of the second switch 1321, a source electrode of the fifth field effect transistor 13211 is the first terminal of the second switch 1321, and a drain electrode of the fifth field effect transistor 13211 is the second terminal of the second switch 1321; and the grid electrode of the fifth field effect transistor 13211 is connected to the output terminal of the current comparator 12, the source electrode of the fifth field effect transistor 13211 is connected to the voltage source, and the drain electrode of the fifth field effect transistor 13211 is connected to the first terminal of the first resistor 1322.

It should be noted that the fifth field effect transistor 13211 may be a P-type field effect transistor, and the grid electrode of the fifth field effect transistor 13211 receives the second signal outputted from the current comparator 12. If the second signal is at a low level, the fifth field effect transistor 13211 is switched on, while if the second signal is at a high level, the fifth field effect transistor 13211 is switched off.

While FIG. 6 shows the inverter and the fifth field effect transistor 13211, this does not mean that both the inverter and the fifth field effect transistor 13211 must be provided. FIG. 6 only shows a structure of the voltage comparison circuit 13 as an example. Taking the voltage comparison circuit 13 shown in FIG. 6 as an example, if the second signal outputted from the current comparator is at a low level, the fifth field effect transistor is switched on, the inverter outputs a high-level enable signal, and the voltage comparator 131 works normally, thereby achieving two controls based on one second signal, with better control effects.

Embodiment IV

Figure 7:
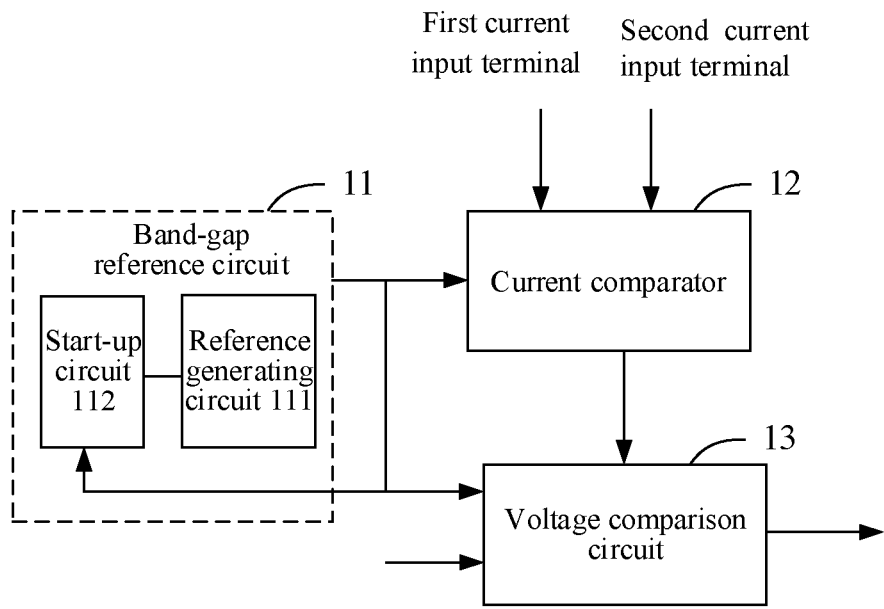
FIG. 7 is a structural diagram of a power-on reset circuit provided in Embodiment IV of the present disclosure.

Embodiment IV of the present disclosure further shows, based on the structure of the power-on reset circuit in Embodiment I, a structure of the band-gap reference circuit of the power-on reset circuit as an example. Of course, only example description is provided here, and does not mean that the present disclosure is limited to this. Alternatively, in Embodiment IV of the present disclosure, the voltage source may power the circuit comparator 12 through the band-gap reference circuit 11, the first current signal and the second current signal are from the band-gap reference circuit 11, a second output terminal of the band-gap reference circuit 11 is connected to the first current input terminal of the current comparator 12 for inputting the first current signal to the current comparator 12; and a third output terminal of the band-gap reference circuit 11 is connected to the second current input terminal of the current comparator 12 for inputting the second current signal to the current comparator 12. As shown in FIG. 7, FIG. 7 is a structural diagram of a power-on reset circuit provided in Embodiment IV of the present disclosure. The band-gap reference circuit 11 includes a reference generating circuit 111 and a start-up circuit 112;

a first output terminal of the reference generating circuit 111 is the first output terminal of the band-gap reference circuit 11, a second output terminal of the reference generating circuit 111 is the second output terminal of the band-gap reference circuit 11, and a third output terminal of the reference generating circuit 111 is the third output terminal of the band-gap reference circuit 11; and an input terminal of the start-up circuit 112 is connected to the first output terminal of the reference generating circuit 111, and a first trigger node of the start-up circuit is connected to a second trigger node of the reference generating circuit 111 for inputting a trigger signal to the second trigger node of the reference generating circuit 111 to trigger operation of the reference generating circuit 111.

Here, two application scenarios are listed respectively to show structures of the reference generating circuit 111 and the start-up circuit 112 in detail.

Figure 8:
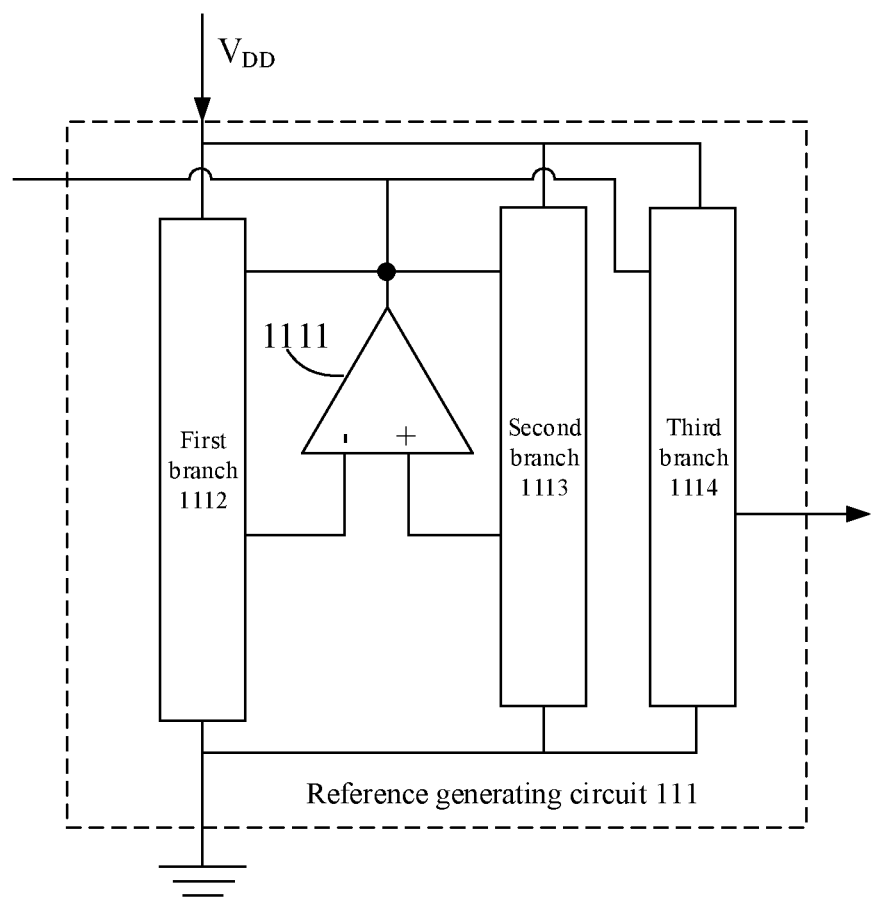
FIG. 8 is a structural diagram of a reference generating circuit provided in Embodiment IV of the present disclosure.

In the first application scenario, the structure of the reference generating circuit 111 is described with reference to FIG. 8 to FIG. 10:

Alternatively, as shown in FIG. 8, FIG. 8 is a structural diagram of a reference generating circuit 111 provided in Embodiment IV of the present disclosure. In this embodiment, the reference generating circuit 111 includes a first branch 1112, a second branch 1113, and a third branch 1114 that are connected in parallel to each other, and an operation amplifier 1111;

the first branch 1112, the second branch 1113, and the third branch 1114 are connected to the voltage source;

an output terminal of the first branch 1112 is connected to an inverting input terminal of the operation amplifier 1111, an output terminal of the second branch 1113 is connected to a non-inverting input terminal of the operation amplifier, and a correlation between a voltage and a temperature at the output terminal of the first branch 1112 is different from a correlation between a voltage and a temperature at the output terminal of the second branch 1113;

an output terminal of the operation amplifier 1111 is connected to a control terminal of the first branch 1112, a control terminal of the second branch 1113, and a control terminal of the third branch 1114 respectively, and the control terminal of the first branch 1112 and the control terminal of the second branch 1113 are trigger nodes of the reference generating circuit 111; and an output terminal of the third branch 1114 is the first output terminal of the reference generating circuit 111.

The correlation between the voltage and the temperature at the output terminal of the first branch 1112 is different from the correlation between the voltage and the temperature at the output terminal of the second branch 1113. For example, there is a positive correlation between the voltage and the temperature at the output terminal of the first branch 1112, and there is a negative correlation between the voltage and the temperature at the output terminal of the second branch 1113; or, there is a negative correlation between the voltage and the temperature at the output terminal of the first branch 1112, and there is a positive correlation between the voltage and the temperature at the output terminal of the second branch 1113. The influence of temperature is reduced after a signal outputted from the first branch 1112 and a signal outputted from the second branch 1113 pass through the operation amplifier 1111, such that the voltage of the first signal outputted from the third branch 1114 is less or not affected by temperature.

Further alternatively, in an embodiment of the present disclosure, the reference generating circuit 111 may output the first current signal and the second current signal to the current comparator 12. As shown in FIG. 9, FIG. 9 is a structural diagram of another reference generating circuit 111 provided in Embodiment IV of the present disclosure. The reference generating circuit 111 further includes a fourth branch 1115 and a fifth branch 1116 that are connected in parallel to each other;

an output terminal of the fourth branch 1115 is the second output terminal of the reference generating circuit 111, an input terminal of the fourth branch 1115 is connected to the voltage source, a control terminal of the fourth branch 1115 is connected to the output terminal of the operation amplifier 1111, and the output terminal of the fourth branch 1115 is connected to the first current input terminal of the current comparator 12 for inputting the first current signal to the current comparator 12; and an output terminal of the fifth branch 1116 is the third output terminal of the reference generating circuit 111, an input terminal of the fifth branch 1116 is connected to the voltage source, a control terminal of the fifth branch 1116 is connected to the output terminal of the operation amplifier 1111, and the output terminal of the fifth branch 1116 is connected to the second current input terminal of the current comparator 12 for inputting the second current signal to the current comparator 12.

Figure 9:
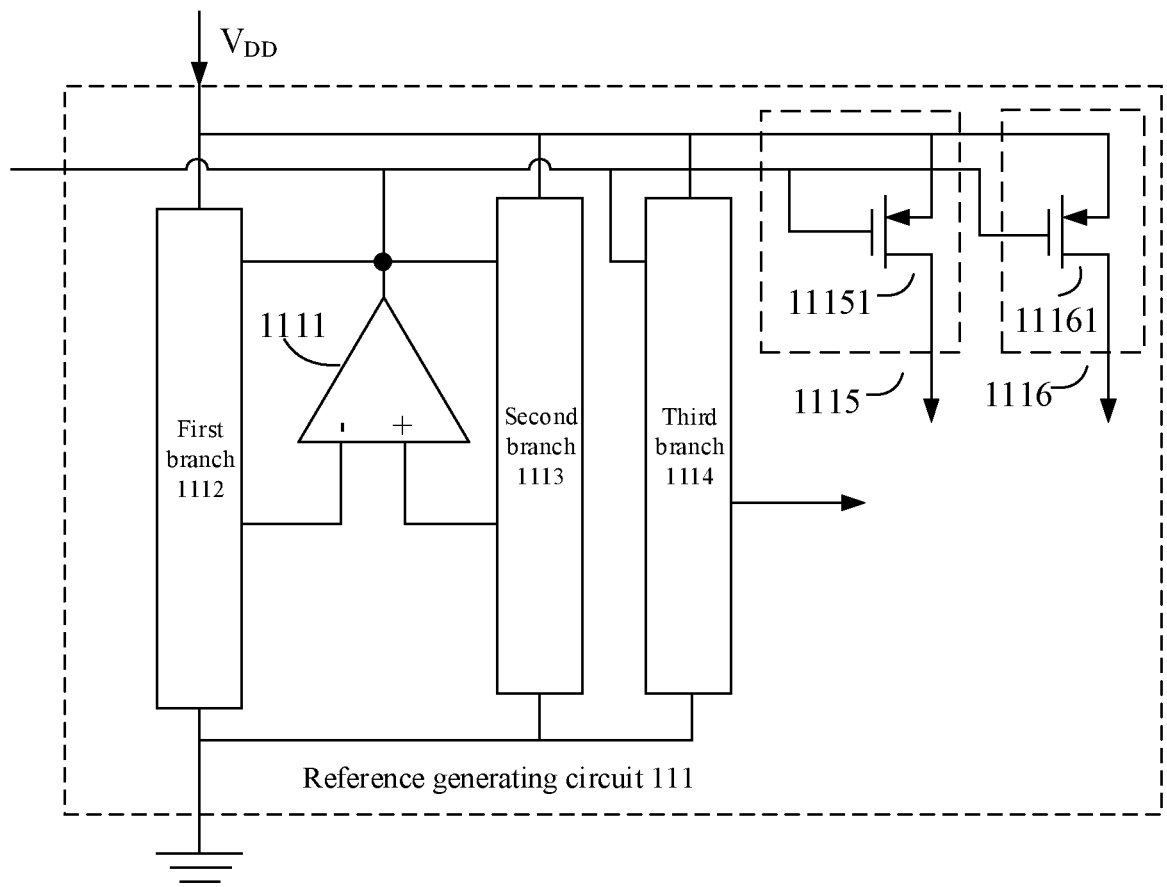
FIG. 9 is a structural diagram of another reference generating circuit provided in Embodiment IV of the present disclosure.

Alternatively, in an embodiment of the present disclosure, as shown in FIG. 9, the fourth switch 1115 includes a sixth field effect transistor 11151;

a grid electrode of the sixth field effect transistor 11151 is the control terminal of the fourth branch 1115, a source electrode of the sixth field effect transistor 11151 is the input terminal of the fourth branch 1115, and a drain electrode of the sixth field effect transistor 11151 is the output terminal of the fourth branch 1115; and the source electrode of the sixth field effect transistor 11151 is connected to the voltage source, the grid electrode of the sixth field effect transistor 11151 is connected to the output terminal of the operation amplifier 1111, and the drain electrode of the sixth field effect transistor 11151 is connected to the first current input terminal of the current comparator 12.

Alternatively, in an embodiment of the present disclosure, as shown in FIG. 9, the fifth switch 1116 includes a seventh field effect transistor 11161;

a grid electrode of the seventh field effect transistor 11161 is the control terminal of the fifth branch 1116, a source electrode of the seventh field effect transistor 11161 is the input terminal of the fifth branch 1116, and a drain electrode of the seventh field effect transistor 11161 is the output terminal of the fifth branch 1116; and the source electrode of the seventh field effect transistor 11161 is connected to the voltage source, the grid electrode of the seventh field effect transistor 11161 is connected to the output terminal of the operation amplifier 1111, and the drain electrode of the seventh field effect transistor 11161 is connected to the second current input terminal of the current comparator 12.

It should be noted that the signal outputted from the first branch 1112 and the signal outputted from the second branch 1113 are processed by the operation amplifier 1111 to output a control signal, which can satisfy the requirements for switch-on of the fifth field effect transistor and the sixth field effect transistor 11151. The fifth field effect transistor and the sixth field effect transistor 11151 may be P-type field effect transistors, and the control signal outputted from the operation amplifier 1111 may be a low-level signal, but the control signal is not a 0-potential signal, but a signal smaller than a threshold voltage of the P-type field effect transistor. Of course, only example description is provided here, and does not mean that the present disclosure is limited to this.

Figure 10:
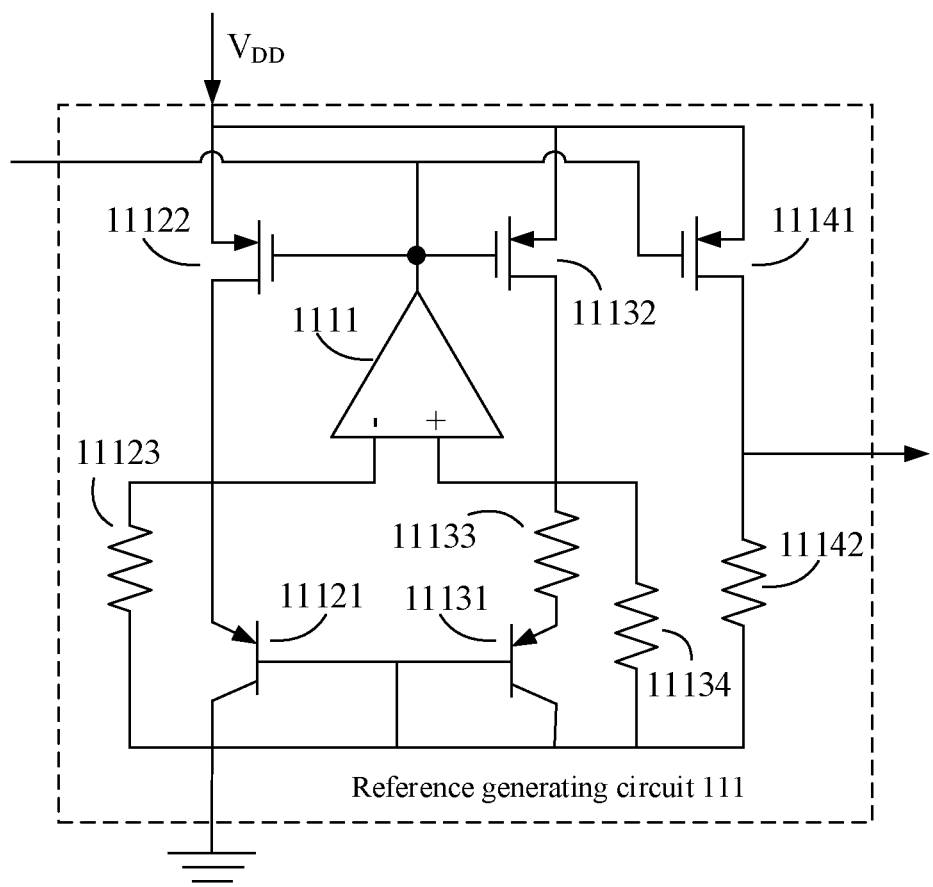
FIG. 10 is a structural diagram of still another reference generating circuit provided in Embodiment IV of the present disclosure.

Alternatively, based on the reference generating circuit shown in FIG. 8, FIG. 10 is a structural diagram of still another reference generating circuit 111 provided in Embodiment IV of the present disclosure. Taking FIG. 10 as an example, structures of the first branch 1112, the second branch 1113, and the third branch 1114 of the reference generating circuit 111 are described respectively.

Alternatively, in a first example, as shown in FIG. 10, the structure of the third branch 1114 is described. The third branch 1114 includes an eighth field effect transistor 11141 and a third resistor 11142;

a drain electrode of the eighth field effect transistor 11141 is the output terminal of the third branch 1114; a source electrode of the eighth field effect transistor 11141 is connected to the voltage source, a grid electrode of the eighth field effect transistor 11141 is connected to the output terminal of the operation amplifier 1111, the drain electrode of the eighth field effect transistor 11141 is connected to a first terminal of the third resistor 11142; and a second terminal of the third resistor 11142 is grounded.

The eighth field effect transistor 11141 may be a P-type field effect transistor, the control signal outputted from the operation amplifier 1111 is at a low level, the eighth field effect transistor 11141 is switched on, and the drain electrode of the eighth field effect transistor 11141 outputs the second signal.

Alternatively, in a second example, as shown in FIG. 10, the structure of the first branch 1112 is described. The first branch 1112 includes a first bipolar junction transistor 11121, a ninth field effect transistor 11122, and a fourth resistor 11123;

a grid electrode of the ninth field effect transistor 11122 is the control terminal of the first branch 1112, and a drain electrode of the ninth field effect transistor 11122 is the output terminal of the first branch 1112;

a source electrode of the ninth field effect transistor 11122 is connected to the voltage source, the grid electrode of the ninth field effect transistor 11122 is connected to the output terminal of the operation amplifier 1111, and the drain electrode of the ninth field effect transistor 11122 is connected to the non-inverting input terminal of the operation amplifier 1111;

one terminal of the fourth resistor 11123 is connected to the drain electrode of the ninth field effect transistor 11122, and the other terminal of the fourth resistor is grounded; and an emitter electrode of the first bipolar junction transistor 11121 is connected to the drain electrode of the ninth field effect transistor 11122, and a base electrode and a collector electrode of the first bipolar junction transistor 11121 are both grounded.

It should be noted that the ninth field effect transistor 11122 may be a P-type field effect transistor, and there is a negative correlation between a voltage (i.e., voltage at the drain electrode of the ninth field effect transistor 11122) and a temperature at the output terminal of the first branch 1112.

Alternatively, in a third example, as shown in FIG. 10, the structure of the second branch 1113 is described. The second branch 1113 includes a second bipolar junction transistor 11131, a tenth field effect transistor 11132, a fifth resistor 11133, and a sixth resistor 11134;

a grid electrode of the tenth field effect transistor 11132 is the control terminal of the second branch 1113, and a drain electrode of the tenth field effect transistor 11132 is the output terminal of the second branch 1113;

a source electrode of the tenth field effect transistor 11132 is connected to the voltage source, the grid electrode of the tenth field effect transistor 11132 is connected to the output terminal of the operation amplifier 1111, and the drain electrode of the tenth field effect transistor 11132 is connected to the non-inverting input terminal of the operation amplifier 1111;

one terminal of the fifth resistor 11133 is connected to the drain electrode of the tenth field effect transistor 11132, and the other terminal of the fifth resistor is connected to the emitter electrode of the second bipolar junction resistor 11131;

one terminal of the sixth resistor 11134 is connected to the drain electrode of the tenth field effect transistor 11132, and the other terminal of the sixth resistor is grounded; and a collector electrode and a base electrode of the second bipolar junction transistor 11131 are both grounded.

It should be noted that the tenth field effect transistor 11132 may be a P-type field effect transistor, and there is a negative correlation between a voltage (i.e., voltage at the drain electrode of the tenth field effect transistor 11132) and a temperature at the output terminal of the second branch 1113.

Referring to the above three examples, it should be noted that FIG. 10 shows a specific structure of each branch, and does not mean that the embodiment of the present disclosure is limited to this. The structure of the reference generating circuit 111 may also be in other forms. This is not limited in the present disclosure. Taking the reference generating circuit 111 shown in FIG. 10 as an example, the eighth field effect transistor 11141, the ninth field effect transistor 11122, and the tenth field effect transistor 11132 form a current mirror 122. A current on the eighth field effect transistor 11141 is duplicated based on the structure of the current mirror 122. Similarly, FIG. 9 and FIG. 10 are combined. The sixth field effect transistor 11151, the seventh field effect transistor 11161, and the eighth field effect transistor 11141 form a current mirror, and the ninth field effect transistor 11122 and the tenth field effect transistor 11132 also form a current mirror 122. Currents of the sixth field effect transistor 11151 and the seventh field effect transistor 11161 are also duplicated based on the current mirror 122. Of course, only example description is provided here, and does not mean that the present disclosure is limited to this.

Figure 11:
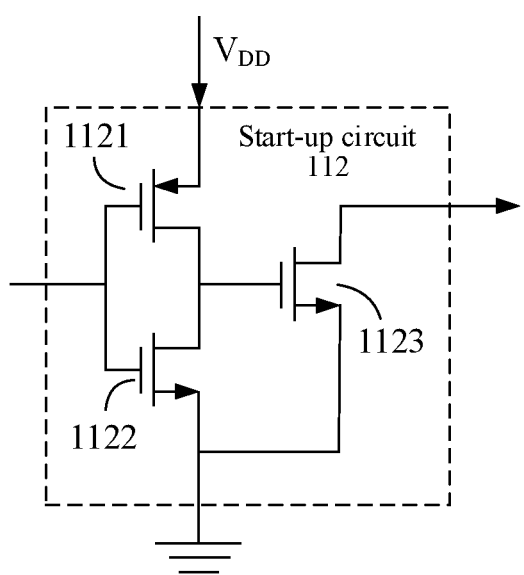
FIG. 11 is a structural diagram of a start-up circuit provided in Embodiment IV of the present disclosure.

In the second application scenario, a structure of the start-up circuit 112 is described with reference to FIG. 11. Alternatively, in an embodiment of the present disclosure, as shown in FIG. 11, FIG. 11 is a structural diagram of a start-up circuit provided in Embodiment IV of the present disclosure. The start-up circuit 112 includes an eleventh field effect transistor 1121, a twelfth field effect transistor 1122, and a thirteenth field effect transistor 1123;

where a grid electrode of the eleventh field effect transistor and a grid electrode of the twelfth field effect transistor are the input terminal of the start-up circuit, and a drain electrode of the thirteenth field effect transistor is the first trigger node;

a source electrode of the eleventh field effect transistor is connected to the voltage source, the grid electrode of the eleventh field effect transistor is connected to the first output terminal of the reference generating circuit 111, and the drain electrode of the eleventh field effect transistor is connected to a drain electrode of the twelfth field effect transistor and a grid electrode of the thirteenth field effect transistor respectively;

the grid electrode of the twelfth field effect transistor is connected to the first output terminal of the reference generating circuit 111, and a source electrode of the twelfth field effect transistor is grounded; and the drain electrode of the thirteenth field effect transistor is connected to the second trigger node, and a source electrode of the thirteenth field effect transistor is grounded.

It should be noted that the eleventh field effect transistor may be a P-type field effect transistor, and the twelfth field effect transistor and the thirteenth field effect transistor may be N-type field effect transistors. The input terminal of the start-up circuit is connected to the first output terminal of the reference generating circuit 111. Therefore, a first signal outputted from the first output terminal of the reference generating circuit 111 may control a state of the start-up circuit. As shown in FIG. 11, when the first signal is at a low level, the grid electrode of the eleventh field effect transistor and the grid electrode of the thirteenth field effect transistor are at a low level, the eleventh field effect transistor is switched on, and the thirteenth field effect transistor is switched off. In this case, the drain electrode of the eleventh field effect transistor is at a high level, the grid electrode of the twelfth field effect transistor is at a high level, the first trigger node (the grid electrode of the twelfth field effect transistor) is at a high level, and the twelfth field effect transistor is switched on, to pull the voltage at the second trigger node to a low level, such that the reference generating circuit 111 works. When the second signal is at a high level, the grid electrode of the eleventh field effect transistor and the grid electrode of the thirteenth field effect transistor are at a high level, the eleventh field effect transistor is switched off, and the thirteenth field effect transistor is switched on. In this case, the first trigger node (the grid electrode of the twelfth field effect transistor) is at a low level, and the start-up circuit no longer outputs a trigger signal to the reference generating circuit 111. Referring to the reference generating circuit 111 shown in FIG. 9, the second trigger node may be the output terminal of the operation amplifier 1111, and the trigger signal may be a low-level signal. When the first trigger node is at a high level, the voltage at the second trigger node is pulled to a low level, such that the eighth field effect transistor 11141, the ninth field effect transistor, and the tenth field effect transistor 11132 are switched on, and the sixth field effect transistor 11151 and the seventh field effect transistor 11161 are also switched on. In this case, the reference generating circuit 111 starts to work, and the first output terminal of the reference generating circuit 111 outputs a first signal, which is a high-level signal. After the reference generating circuit 111 starts to work, the first trigger node (the grid electrode of the twelfth field effect transistor becomes at a low level, the twelfth field effect transistor is switched off, and the reference generating circuit 111 keeps the eighth field effect transistor 11141, the ninth field effect, the tenth field effect transistor 11132, the sixth field effect transistor 11151, and the seventh field effect transistor 11161 switched on based on the control signal outputted from the output terminal of the operation amplifier 1111.

Referring to the reference generating circuit shown in FIG. 10, the first branch, the second branch, and the third branch are connected in parallel. Therefore, the voltage across the reference generating circuit ensures that each branch can work. Therefore, if the voltage across the band-gap reference circuit is greater than or equal to the drive voltage of the tenth field effect transistor, the fifth resistor, and the second bipolar junction transistor, the band-gap reference circuit can work normally. Therefore, the band-gap reference circuit in embodiments of the present disclosure can work under a low voltage, with low energy consumption.

Embodiment V

Figure 12:
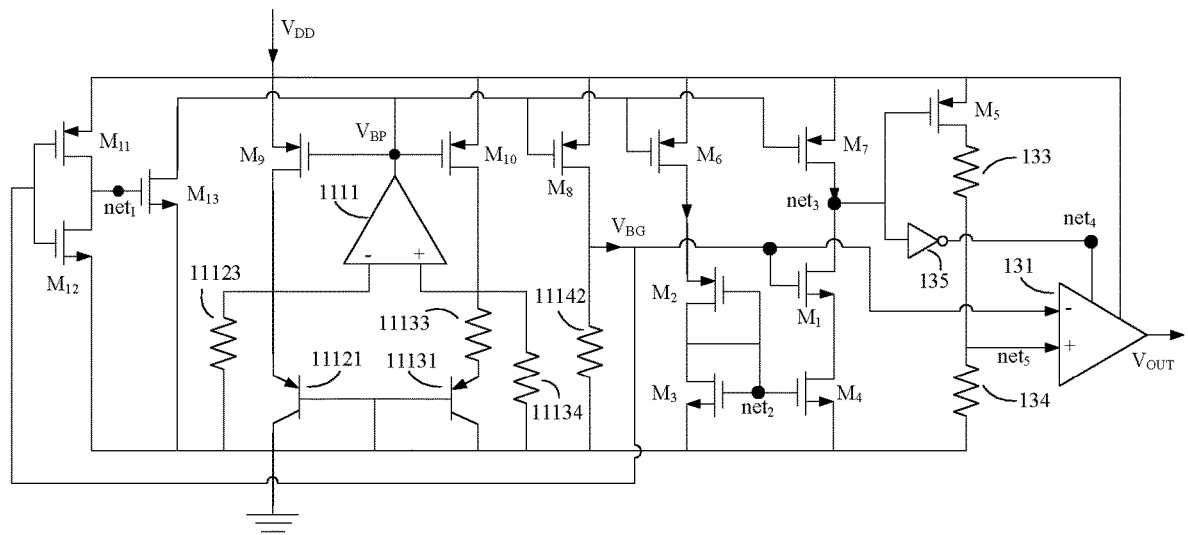
FIG. 12 is a structural diagram of a power-on reset circuit provided in Embodiment V of the present disclosure.

Based on a specific structure of the power-on reset circuit described in Embodiment I to Embodiment IV and of each circuit in the power-on reset circuit, Embodiment V of the present disclosure provides a power-on reset circuit, and provides more comprehensive and detailed description of the power-on reset circuit. In this embodiment, M denotes a field effect transistor, $M_1$ denotes the first field effect transistor, $M_2$ denotes the second field effect transistor 1231, . . . , and $M_{13}$ denotes the thirteenth field effect transistor. It should be noted that, in Embodiment V of the present disclosure, names of the elements are the same as those in Embodiment I to Embodiment V. As shown in FIG. 12, the power-on reset circuit includes the reference generating circuit 111, the current comparator 12, the voltage comparison circuit 13, and the start-up circuit 112.

The current comparator 12 includes the first field effect transistor $M_1$, the second field effect transistor $M_2$, the third field effect transistor $M_3$, and the fourth field effect transistor $M_4$, where grid electrodes of $M_2$, $M_3$, and $M_4$ are connected at a node $net_2$, and the grid electrode of $M_3$ is connected to a drain electrode thereof;

the voltage comparison circuit 13 includes the voltage comparator 131, the fifth field effect transistor $M_5$, the first resistor 1322, the second resistor 1323, and the inverter 133;

the reference generating circuit 111 includes the sixth field effect transistor to the tenth field effect transistor, namely $M_6$ to $M_{10}$, and further includes the operation amplifier 1111, the third resistor 11142, the fourth resistor 11123, the fifth resistor 11133, the sixth resistor 11134, the first bipolar junction transistor 11121, and the second bipolar junction transistor 11131; and the start-up circuit 112 includes an eleventh field effect transistor $M_{11}$, a twelfth field effect transistor $M_{12}$, and a thirteenth field effect transistor $M_{13}$.

A connection relationship between various elements is described in Embodiment I to Embodiment V in detail, and will not be repeated here.

Here, based on the power-on reset circuit shown in FIG. 12, fast power-on and slow power-on processes of power sources are described in detail respectively.

Alternatively, when the power source is slowly powered on, i.e., build-up time of the power supply voltage is longer than build-up time of the band-gap reference circuit, for example, it takes 1 ms to power on the power supply voltage $V_{DD}$, and it takes 100 us to complete building the band-gap reference circuit. When the power supply voltage $V_{DD}$ slowly rises from 0, the band-gap reference circuit has not yet started to work. In this case, the voltage $V_{BG}$ outputted from the first output terminal of the band-gap reference circuit is a low-level signal. Therefore, in the start-up circuit of the band-gap reference circuit, $M_{11}$ is first switched on, such that the voltage at a node $net_1$ of the drain electrode of $M_{11}$ flips to a high level following the rise of the power supply voltage. When the voltage at the node $net_1$ rises with the power supply voltage $V_{DD}$ to greater than a threshold voltage of $M_{13}$, $M_{13}$ is switched on, and the voltage $V_{BP}$ (i.e., the voltage at the second trigger node) is pulled down to a low level, such that $M_9$ and $M_{10}$ are switched on, and the band-gap reference circuit is started. In the slow power-on process, the build-up time of the band-gap reference circuit is faster than the power-on time of the power supply voltage. Therefore, when the band-gap reference circuit has been built, the voltage $V_{BG}$ of the first signal outputted from the band-gap reference circuit is greater than the first preset value, power-on of the power supply voltage has not yet been completed. In this case, the power supply voltage has not reached the voltage that enables the current comparator to work. Therefore, the current comparator does not work, and the voltage at $net_3$ of the drain electrode of $M_7$ is at a high level following the rise of the power supply voltage, such that $M_5$ is switched off, and $net_5$ at the non-inverting input terminal of the voltage comparator 131 is at a low level. An enable terminal $net_4$ of the voltage comparator 131 is at a low level, the voltage comparator does not work, and the voltage $V_{OUT}$ outputted from the voltage comparator is 0.

When the power supply voltage rises to greater than or equal to a sum of a threshold voltage of $M_2$, a threshold voltage of $M_3$ and an overdrive voltage of $M_6$ (i.e., the power supply voltage rises such that a voltage across the current comparator is greater than or equal to its operating voltage, i.e., the power supply voltage is greater than or equal to the second preset value). In this case, $V_{BG}$ has stably outputted a high level, $M_1$ is switched on, and the current comparator works, such that $net_3$ flips to a low level, $M_5$ is switched on, and $net_5$ flips to a high level following the rise of the power supply voltage. $Net_4$ flips to a high level following the rise of the power supply voltage, and the voltage comparator starts to work. However, because a voltage at $net_5$ at the non-inverting input terminal of the voltage comparator is less than the voltage $V_{BG}$ at the inverting input terminal of the voltage comparator, the voltage $V_{OUT}$ outputted from the voltage comparator is still 0.

Figure 13:
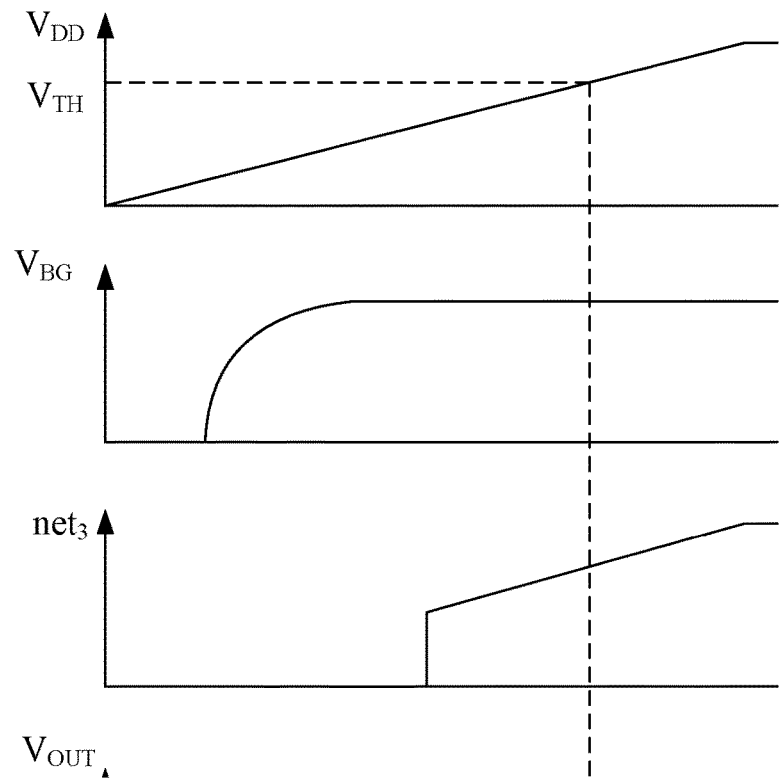
FIG. 13 is a schematic diagram of a slow power-on signal change provided in Embodiment V of the present disclosure.

When the power supply voltage continues to rise such that the voltage at $net_5$ is greater than $V_{BG}$ (i.e., the voltage at the non-inverting input terminal of the voltage comparator is greater than the voltage at the inverting input terminal). In this case, the power supply voltage $V_{DD}$ is equal to the threshold voltage $V_{TH}$ of the reset signal outputted from the voltage comparator 131. The threshold voltage $V_{TH}$ may be computed by referring to formula II in the above Embodiment III, which will not be repeated here. The output voltage $V_{OUT}$ of the voltage comparator flips to a high level following the rise of the power supply voltage, thus generating a reset signal. The process thereof is as shown in FIG. 13.

Alternatively, when the power source is fast powered on, i.e., the build-up time of the power supply voltage is shorter than the build-up time of the band-gap reference circuit, for example, it takes 10 us to power on the $V_{DD}$, and it takes 100 us to complete building the band-gap reference circuit. When the power supply voltage $V_{DD}$ slowly rises from 0, $M_{11}$ in the band-gap reference start-up circuit is first switched on, such that $net_1$ flips to a high level following the rise of the power supply voltage. When the voltage level of $net_1$ rises to greater than the threshold voltage of $M_3$, $M_3$ is switched on, the voltage $V_{BP}$ is pulled down to a low level, and the band-gap reference circuit is started. In this case, $net_3$ is at a high level following the rise of the power supply voltage, such that $M_5$ is switched off, and $net_5$ is at a low level. $Net_4$ is at a low level, the voltage comparator does not work, and the output from the voltage comparator is 0.

Because the power supply voltage $V_{DD}$ rises fast, the band-gap reference circuit has not been built, when the power supply voltage has been built. In this case, the power supply voltage has been greater than the sum of the threshold voltage of $M_2$, the threshold voltage of $M_3$, and the overdrive voltage of $M_6$ (i.e., the power supply voltage rises such that the voltage across the current comparator is greater than or equal to its operating voltage, i.e., the power supply voltage is greater than or equal to the second preset value). However, due to the relatively long build-up time of the band-gap reference, the voltage $V_{BG}$ rises slowly. Therefore, $M_1$ is still not switched on, $net_4$ is at a low level, the voltage comparator does not work, and the output is still 0.

Figure 14:
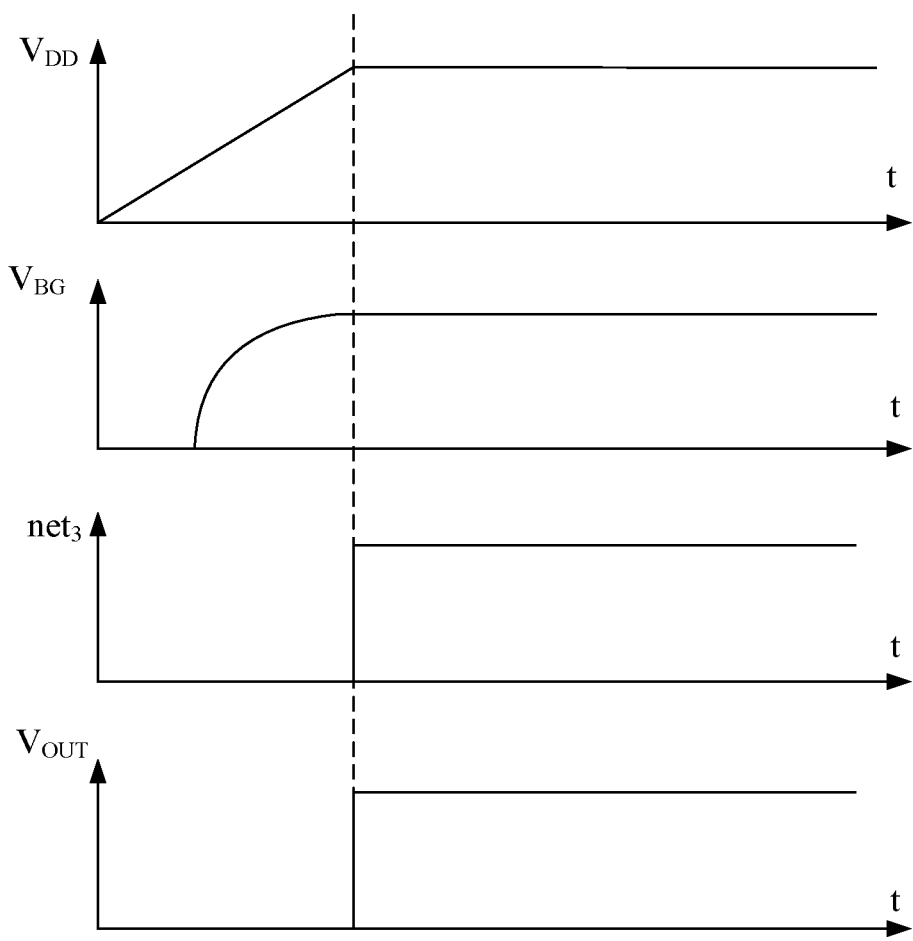
FIG. 14 is a schematic diagram of a fast power-on signal change provided in Embodiment V of the present disclosure.

When $V_{BG}$ rises such that $M_1$ starts to be switched on, i.e., the voltage $V_{BG}$ of the first signal outputted from the band-gap reference circuit is greater than the first preset value, and $net_3$ flips to a low level, such that $M_5$ is switched on. $Net_4$ flips to a high level, and the voltage comparator starts to work. In this case, the voltage level of $net_5$ at the non-inverting input terminal of the voltage comparator has been greater than $V_{BG}$ at the inverting input terminal, such that the voltage comparator immediately outputs a high level to generate a reset signal. The process thereof is as shown in FIG. 14.

A power-on reset circuit provided in embodiments of the present disclosure includes a band-gap reference circuit, a current comparator, and a voltage comparison circuit. The band-gap reference circuit, the current comparator, the voltage comparison circuit are powered by a voltage source. A first signal outputted from the band-gap reference circuit can control the current comparator to work, and the current comparator is powered by the voltage source. Therefore, only after both the power supply voltage and the band-gap reference circuit meet the requirements, will the current comparator work and output a second signal. The outputted second signal is used to control the voltage comparator to work and output a reset signal, thereby avoiding occurrence of an error caused by output of the reset signal when the band-gap reference circuit is unstable, reducing false trigger during the power-on process, and increasing the power-on reliability.

So far, specific embodiments of this subject matter have been described. Other embodiments fall within the scope of the appended claims. In some cases, actions disclosed in the appended claims may be performed in different orders and can still achieve desired results. In addition, the processes depicted in the figures are not necessarily required to achieve the desired results in the shown particular order or sequential order. In some embodiments, multitasking and parallel processing may be advantageous.

It should be further noted that the terms such as "comprising", "including" or any other variation thereof are intended to cover non-exclusive inclusions, such that a process, a method, an article, or a device that includes a series of elements not only includes those elements, but also includes other elements that are not explicitly listed, or further includes elements that are inherent to such a process, method, article, or device. An element defined by the wording "comprises a . . . " does not, without more constraints, preclude the existence of other identical elements in the process, the method, the article, or the device that includes the element.

The above description merely provides embodiments of the present disclosure, and is not intended to limit the present disclosure. For those skilled in the art, the present disclosure may have various modifications and alterations. Any modification, equivalent replacement, improvement, and the like made within the spirit and principles of the present disclosure should be included within the scope of the appended claims of the present disclosure.

What is claimed is:

1. A power-on reset circuit, comprising: a band-gap reference circuit, a current comparator, and a voltage comparison circuit, the band-gap reference circuit, the current comparator, and the voltage comparison circuit being powered by a voltage source;
   wherein a first output terminal of the band-gap reference circuit is connected to a control terminal of the current comparator, for inputting a first signal to the control terminal of the current comparator to control operation of the current comparator;
   a first current input terminal of the current comparator receives a first current signal, a second current input terminal of the current comparator receives a second current signal, and an output terminal of the current comparator is connected to a control terminal of the voltage comparison circuit for inputting a second signal to the control terminal of the voltage comparison circuit to control operation of the voltage comparison circuit; and
   a first input terminal of the voltage comparison circuit is connected to the first output terminal of the band-gap reference circuit, a second input terminal of the voltage comparison circuit receives a signal indicating a voltage value of the voltage source, and an output terminal of the voltage comparison circuit is used to output a power-on reset signal.

2. The power-on reset circuit according to claim 1, wherein the current comparator comprises a first switch and a current mirror;
   a first input terminal of the current mirror receives the first current signal, wherein the first switch comprises a first field effect transistor, a drain electrode of the first field effect transistor is the first terminal of the first switch, a source electrode of the first field effect transistor is the second terminal of the first switch, and a grid electrode of the first field effect transistor is the control terminal of the first switch, the drain electrode of the first field effect transistor receives the second current signal, the source electrode of the first field effect transistor is connected to the second input terminal of the current mirror, and the grid electrode of the first field effect transistor is connected to the first output terminal of the band-gap reference circuit; and
   a first terminal of the first switch is the second current input terminal and the output terminal of the current comparator, a second terminal of the first switch is connected to a second input terminal of the current mirror, and a control terminal of the first switch is the control terminal of the current comparator.

3. The power-on reset circuit according to claim 2, wherein the current comparator further comprises a voltage limiting element; and
   a first terminal of the voltage limiting element is the first current input terminal of the current comparator, a second terminal of the voltage limiting element is connected to the first input terminal of the current mirror, and the first input terminal of the current mirror receives the first current signal through the voltage limiting element.

4. The power-on reset circuit according to claim 3, wherein the voltage limiting element comprises a second field effect transistor;
   a source electrode of the second field effect transistor is the first terminal of the voltage limiting element, and a drain electrode of the second field effect transistor is the second terminal of the voltage limiting element; and
   the source electrode of the second field effect transistor receives the first current signal, the drain electrode of the second field effect transistor is connected to the first input terminal of the current mirror, and a grid electrode of the second field effect transistor is connected to the drain electrode of the second field effect transistor.

5. The power-on reset circuit according to claim 2, wherein the current mirror comprises a third field effect transistor and a fourth field effect transistor;
   a drain electrode of the third field effect transistor is the first input terminal of the current mirror, and a drain electrode of the fourth field effect transistor is the second input terminal of the current mirror; and
   the drain electrode of the third field effect transistor is connected to a grid electrode of the third field effect transistor, and the grid electrode of the third field effect transistor is connected to a grid electrode of the fourth field effect transistor.

6. The power-on reset circuit according to claim 1, wherein
   a current of the first current signal is greater than a current of the second current signal, and the second signal is a high-level signal.

7. The power-on reset circuit according to claim 1, wherein the voltage comparison circuit comprises a voltage division control branch and a voltage comparator;
   an input terminal of the voltage division control branch is the second input terminal of the voltage comparison circuit, a control terminal of the voltage division control branch is the control terminal of the voltage comparison circuit, the control terminal of the voltage division control branch is connected to the output terminal of the current comparator, a first output terminal of the voltage division control branch is connected to a non-inverting input terminal of the voltage comparator, and a second output terminal of the voltage division control branch is grounded; and
   an inverting input terminal of the voltage comparator is the first input terminal of the voltage comparison circuit, an output terminal of the voltage comparator is the output terminal of the voltage comparison circuit, and the inverting input terminal of the voltage comparator is connected to the first output terminal of the band-gap reference circuit.

8. The power-on reset circuit according to claim 7, wherein the voltage division control branch comprises a second switch, a first resistor, and a second resistor;
   wherein a first terminal of the second switch is the input terminal of the voltage division control branch, and a control terminal of the second switch is the control terminal of the voltage division control branch;
   the first terminal of the second switch is connected to the voltage source, and a second terminal of the second switch is connected to a first terminal of the first resistor;
   a second terminal of the first resistor is the first output terminal of the voltage division control branch, the second terminal of the first resistor is connected to a first terminal of the second resistor, and the second terminal of the first resistor is connected to the non-inverting input terminal of the voltage comparator; and wherein a second terminal of the second resistor is the second output terminal of the voltage division control branch, and the second terminal of the second resistor is grounded.

9. The power-on reset circuit according to claim 8, wherein the second switch comprises a fifth field effect transistor;

a grid electrode of the fifth field effect transistor is the control terminal of the second switch, a source electrode of the fifth field effect transistor is the first terminal of the second switch, and a drain electrode of the fifth field effect transistor is the second terminal of the second switch; and the grid electrode of the fifth field effect transistor is connected to the output terminal of the current comparator, the source electrode of the fifth field effect transistor is connected to the voltage source, and the drain electrode of the fifth field effect transistor is connected to the first terminal of the first resistor.

10. The power-on reset circuit according to claim 7, wherein the voltage comparison circuit further comprises an inverter; and an input terminal of the inverter is connected to the output terminal of the current comparator, and an output terminal of the inverter is connected to an enable terminal of the voltage comparator for inputting an enable signal to the enable terminal of the voltage comparator.

11. The power-on reset circuit according to claim 1, wherein the first current signal and the second current signal are from the band-gap reference circuit, a second output terminal of the band-gap reference circuit is connected to the first current input terminal of the current comparator for inputting the first current signal to the current comparator; and a third output terminal of the band-gap reference circuit is connected to the second current input terminal of the current comparator for inputting the second current signal to the current comparator.

12. The power-on reset circuit according to claim 11, wherein the band-gap reference circuit comprises a start-up circuit and a reference generating circuit;

a first output terminal of the reference generating circuit is the first output terminal of the band-gap reference circuit, a second output terminal of the reference generating circuit is the second output terminal of the band-gap reference circuit, and a third output terminal of the reference generating circuit is the third output terminal of the band-gap reference circuit; and an input terminal of the start-up circuit is connected to the first output terminal of the reference generating circuit, and a first trigger node of the start-up circuit is connected to a second trigger node of the reference generating circuit for inputting a trigger signal to the second trigger node of the reference generating circuit to trigger operation of the reference generating circuit.

13. The power-on reset circuit according to claim 12, wherein the reference generating circuit comprises a first branch, a second branch, and a third branch that are connected in parallel to each other, and an operation amplifier;

the first branch, the second branch, and the third branch are connected to the voltage source;

an output terminal of the first branch is connected to an inverting input terminal of the operation amplifier, an output terminal of the second branch is connected to a non-inverting input terminal of the operation amplifier, and a correlation between a voltage and a temperature at the output terminal of the first branch is different from a correlation between a voltage and a temperature at the output terminal of the second branch;

an output terminal of the operation amplifier is connected to a control terminal of the first branch, a control terminal of the second branch, and a control terminal of the third branch respectively, and the control terminal of the first branch and the control terminal of the second branch are trigger nodes of the reference generating circuit; and an output terminal of the third branch is the first output terminal of the reference generating circuit.

14. The power-on reset circuit according to claim 13, wherein the reference generating circuit further comprises a fourth branch and a fifth branch that are connected in parallel to each other;

an output terminal of the fourth branch is the second output terminal of the reference generating circuit, an input terminal of the fourth branch is connected to the voltage source, a control terminal of the fourth branch is connected to the output terminal of the operation amplifier, and the output terminal of the fourth branch is connected to the first current input terminal of the current comparator for inputting the first current signal to the current comparator; and an output terminal of the fifth branch is the third output terminal of the reference generating circuit, an input terminal of the fifth branch is connected to the voltage source, a control terminal of the fifth branch is connected to the output terminal of the operation amplifier, and the output terminal of the fifth branch is connected to the second current input terminal of the current comparator for inputting the second current signal to the current comparator.

15. The power-on reset circuit according to claim 14, wherein the fourth branch comprises a sixth field effect transistor;

a grid electrode of the sixth field effect transistor is the control terminal of the fourth branch, a source electrode of the sixth field effect transistor is the input terminal of the fourth branch, and a drain electrode of the sixth field effect transistor is the output terminal of the fourth branch; and the source electrode of the sixth field effect transistor is connected to the voltage source, the grid electrode of the sixth field effect transistor is connected to the output terminal of the operation amplifier, and the drain electrode of the sixth field effect transistor is connected to the first current input terminal of the current comparator.

16. The power-on reset circuit according to claim 14, wherein the fifth branch comprises a seventh field effect transistor;

a grid electrode of the seventh field effect transistor is the control terminal of the fifth branch, a source electrode of the seventh field effect transistor is the input terminal of the fifth branch, and a drain electrode of the seventh field effect transistor is the output terminal of the fifth branch; and the source electrode of the seventh field effect transistor is connected to the voltage source, the grid electrode of the seventh field effect transistor is connected to the output terminal of the operation amplifier, and the drain electrode of the seventh field effect transistor is connected to the second current input terminal of the current comparator.

17. The power-on reset circuit according to claim 13, wherein the third branch comprises an eighth field effect transistor and a third resistor; and
    a drain electrode of the eighth field effect transistor is the output terminal of the third branch; a source electrode of the eighth field effect transistor is connected to the voltage source, a grid electrode of the eighth field effect transistor is connected to the output terminal of the operation amplifier, the drain electrode of the eighth field effect transistor is connected to a first terminal of the third resistor; and a second terminal of the third resistor is grounded.

18. The power-on reset circuit according to claim 13, wherein the first branch comprises a first bipolar junction transistor, a ninth field effect transistor, and a fourth resistor;
    a grid electrode of the ninth field effect transistor is the control terminal of the first branch, and a drain electrode of the ninth field effect transistor is the output terminal of the first branch;
    a source electrode of the ninth field effect transistor is connected to the voltage source, the grid electrode of the ninth field effect transistor is connected to the output terminal of the operation amplifier, and the drain electrode of the ninth field effect transistor is connected to the non-inverting input terminal of the operation amplifier;
    one terminal of the fourth resistor is connected to the drain electrode of the ninth field effect transistor, and the other terminal of the fourth resistor is grounded; and
    an emitter electrode of the first bipolar junction transistor is connected to the drain electrode of the ninth field effect transistor, and a base electrode and a collector electrode of the first bipolar junction transistor are both grounded.

19. The power-on reset circuit according to claim 13, wherein the second branch comprises a second bipolar junction transistor, a tenth field effect transistor, a fifth resistor, and a sixth resistor;
    a grid electrode of the tenth field effect transistor is the control terminal of the second branch, and a drain electrode of the tenth field effect transistor is the output terminal of the second branch;
    a source electrode of the tenth field effect transistor is connected to the voltage source, the grid electrode of the tenth field effect transistor is connected to the output terminal of the operation amplifier, and the drain electrode of the tenth field effect transistor is connected to the non-inverting input terminal of the operation amplifier;
    one terminal of the fifth resistor is connected to the drain electrode of the tenth field effect transistor, and the other terminal of the fifth resistor is connected to the emitter electrode of the second bipolar junction resistor;
    one terminal of the sixth resistor is connected to the drain electrode of the tenth field effect transistor, and the other terminal of the sixth resistor is grounded; and
    a collector electrode and a base electrode of the second bipolar junction transistor are both grounded.

20. The power-on reset circuit according to claim 12, wherein the start-up circuit comprises an eleventh field effect transistor, a twelfth field effect transistor, and a thirteenth field effect transistor;
    wherein a grid electrode of the eleventh field effect transistor and a grid electrode of the twelfth field effect transistor are the input terminal of the start-up circuit, and a drain electrode of the thirteenth field effect transistor is the first trigger node;
    a source electrode of the eleventh field effect transistor is connected to the voltage source, the grid electrode of the eleventh field effect transistor is connected to the first output terminal of the reference generating circuit, and the drain electrode of the eleventh field effect transistor is connected to a drain electrode of the twelfth field effect transistor and a grid electrode of the thirteenth field effect transistor respectively;
    the grid electrode of the twelfth field effect transistor is connected to the first output terminal of the reference generating circuit, and a source electrode of the twelfth field effect transistor is grounded; and
    the drain electrode of the thirteenth field effect transistor is connected to the second trigger node, and a source electrode of the thirteenth field effect transistor is grounded.

* * * * *